(12) United States Patent
Powles et al.

(10) Patent No.: US 11,625,553 B2
(45) Date of Patent: Apr. 11, 2023

(54) RAPID AND ACCURATE MODELING OF A BUILDING CONSTRUCTION STRUCTURE INCLUDING ESTIMATES, DETAILING, AND TAKE-OFFS USING ARTIFICIAL INTELLIGENCE

(71) Applicant: Buildingestimates.Com Limited, Hamilton (NZ)

(72) Inventors: Benjamin John Powles, Hamilton (NZ); Stephen James Thomas, Hamilton (NZ); Shaveer Rajan Mirpuri, Hamilton (NZ)

(73) Assignee: Buildingestimates.Com Limited, Hamilton (NZ)

( * ) Notice: Subject to any disclaimer, the term of this patent is extended or adjusted under 35 U.S.C. 154(b) by 0 days.

(21) Appl. No.: 17/471,956

(22) Filed: Sep. 10, 2021

(65) Prior Publication Data
US 2022/0391627 A1    Dec. 8, 2022

(51) Int. Cl.
*G06Q 10/06*    (2012.01)
*G06F 30/13*    (2020.01)
(Continued)

(52) U.S. Cl.
CPC .......... *G06K 9/6201* (2013.01); *G06F 30/13* (2020.01); *G06F 30/27* (2020.01); *G06K 9/6256* (2013.01);
(Continued)

(58) Field of Classification Search
CPC ........ G06Q 10/06; G06N 5/025; G06F 30/13; G06K 9/62
(Continued)

(56) References Cited

U.S. PATENT DOCUMENTS 10,803,223 B2    10/2020    Kharroubi
2010/0322489 A1  12/2010    Tizhoosh et al.
(Continued)

FOREIGN PATENT DOCUMENTS

AU    2018267643 A1    12/2018
CN    111191371 A      5/2020
(Continued)

OTHER PUBLICATIONS

Redmon, et al., Dec. 25, 2016, 'YOL09000: Better, Faster, Stronger' University of Washington Allen Institute for AI, arXiv:1612.08242v1 available at https://arxiv.org/pdf/1612.08242v1.pdf.
(Continued)

*Primary Examiner* — Nga B Nguyen
(74) *Attorney, Agent, or Firm* — Knobbe, Martens, Olson, Olson & Bear, LLP

(57) ABSTRACT

Some embodiments relate to generating three dimensional virtual representations of a building construction structure based on two-dimensional real-world construction plans, such as architectural plans or building plans. Some embodiments further produce autonomous, near real-time, and highly accurate and comprehensive building take-offs, complete construction detailing or estimates, detailed bill of materials, plan analysis (including detection of a number of non-standardized objects, such as doors or windows), as well as transforming 2D drawings into 3D and/or providing Building Information Modeling (BIM). The two dimensional real-world architectural plan can include multivariate non-standardized architectural symbols, which define numerous objects including trees, bathrooms, doors, stairs, windows, and floor finishes, lines, including solid, hollow, dashed and dotted lines, which define features including internal or external walls, windows, doors, stairs, property boundaries, easements, footpaths, rooflines, driveways,
(Continued)

rights of way, paving stones, landscaping, water, power, drainage, and dimensions, shading, and patterns which define materials and areas on the two dimensional real-world architectural plan, and text which indicate the purposes of the rooms, dimensions, features, construction methods, and regulatory standards.

27 Claims, 21 Drawing Sheets

(51) Int. Cl.
| | |
|---|---|
| *G06K 9/62* | (2022.01) |
| *G06Q 50/08* | (2012.01) |
| *G06Q 10/0875* | (2023.01) |
| *G06Q 10/10* | (2023.01) |
| *G06F 30/27* | (2020.01) |
| *G06Q 10/0631* | (2023.01) |
| *G06V 30/413* | (2022.01) |
| *G06F 40/30* | (2020.01) |
| *G06T 17/00* | (2006.01) |

(52) U.S. Cl.
CPC ... *G06Q 10/06313* (2013.01); *G06Q 10/0875* (2013.01); *G06Q 10/103* (2013.01); *G06Q 50/08* (2013.01); *G06V 30/413* (2022.01); *G06F 40/30* (2020.01); *G06T 17/00* (2013.01)

(58) Field of Classification Search
USPC .......................................................... 382/155
See application file for complete search history.

(56) References Cited

U.S. PATENT DOCUMENTS

| | | | |
|---|---|---|---|
| 2015/0131871 A1* | 5/2015 | Chen | G06T 5/002 382/113 |
| 2015/0310135 A1* | 10/2015 | Forsyth | G06F 30/13 703/1 |
| 2018/0012125 A1 | 1/2018 | Ladha et al. | |
| 2019/0035100 A1* | 1/2019 | Ebrahimi Afrouzi | G06T 7/344 |
| 2021/0026355 A1 | 1/2021 | Chen et al. | |
| 2021/0073449 A1* | 3/2021 | Segev | G06N 5/025 |
| 2021/0089040 A1 | 3/2021 | Ebrahimi Afrouzi et al. | |
| 2021/0150088 A1 | 5/2021 | Gallo et al. | |
| 2021/0294930 A1* | 9/2021 | Cai | G06F 30/13 |

FOREIGN PATENT DOCUMENTS

| | | |
|---|---|---|
| CN | 111783211 A | 10/2020 |
| CN | 111898401 A | 11/2020 |
| CN | 111931269 A | 11/2020 |
| JP | 2007080013 A | 3/2007 |
| JP | 6116746 B1 | 4/2017 |
| KR | 101815034 B1 | 1/2018 |
| WO | WO 2019/177539 | 9/2019 |
| WO | WO 2020/160595 | 8/2020 |
| WO | WO2020247772 A1 | 12/2020 |

OTHER PUBLICATIONS

Redmon, et al., Apr. 8, 2018, 'YOLOv3: An incremental Improvement' arXiv:1804.02767 available at https://pjreddie.com/media/files/papers/YOLOv3.pdf.

Girshick, Ross, Apr. 30, 2015, "Fast R-CNN" arXiv: 1504.08083 available at https://arxiv.org/abs/1504.08083.

Bolya, et al., Apr. 4, 2019. "YOLACT: Real-time Instance Segmentation" arXiv: 1904.02689 available at https://arxiv.org/abs/1904.02689.

Bolya, et al., Dec. 3, 2019. "YOLACT++: Better Real-time Instance Segmentation" arXiv: 1912.06218 available at https://arxiv.org/abs/1912.06218.

Sep. 8, 2022, Written Opinion of International Application No. PCT/US2022/031847 in 9 pages.

* cited by examiner

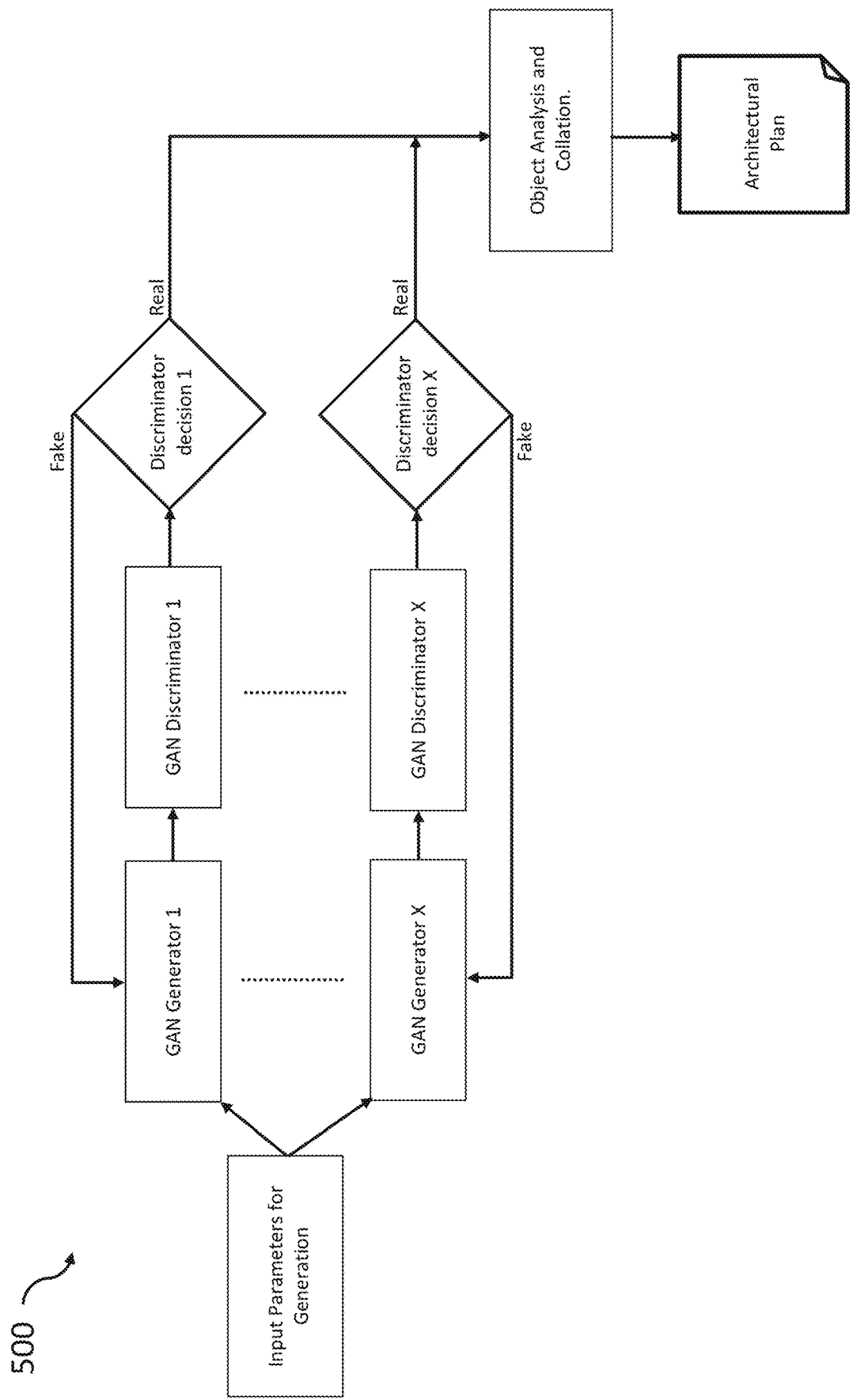

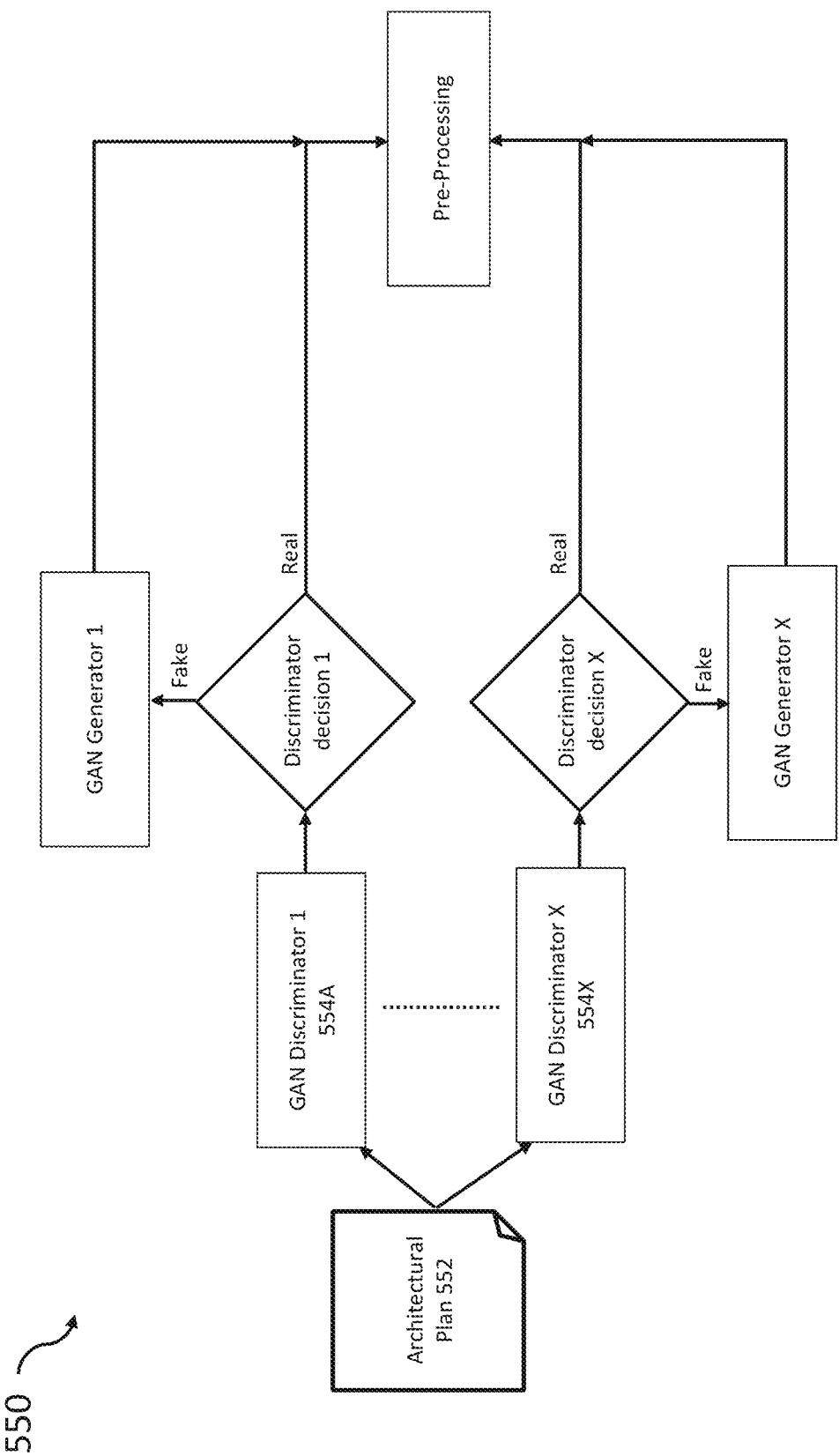

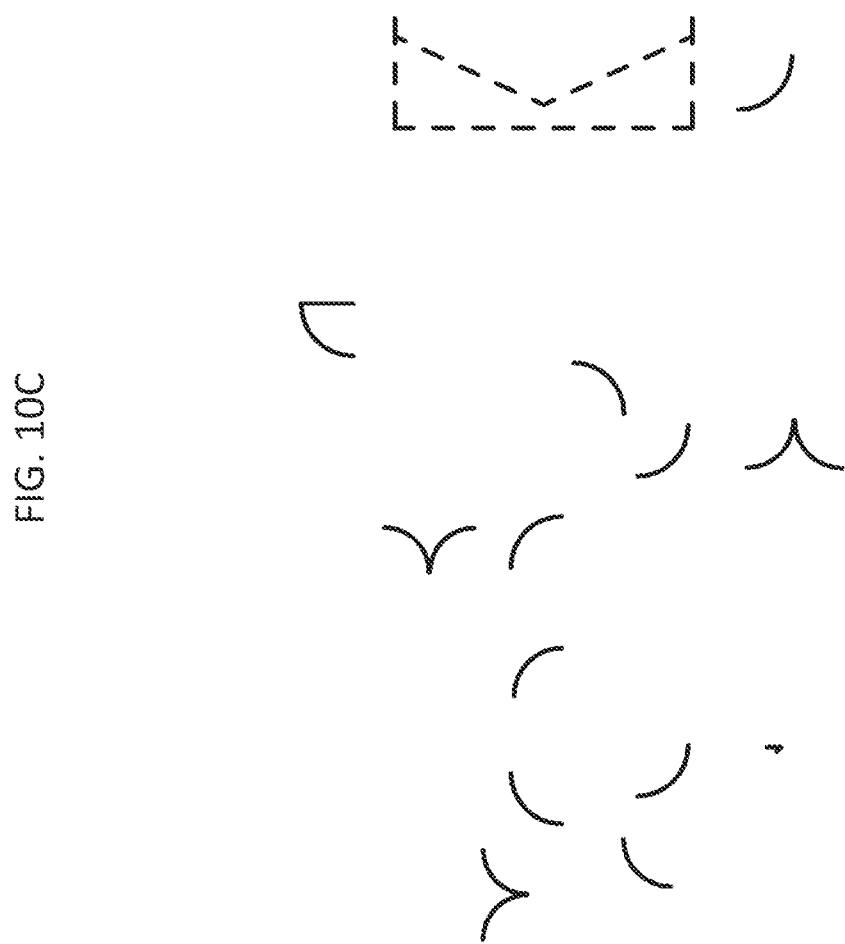

RAPID AND ACCURATE MODELING OF A BUILDING CONSTRUCTION STRUCTURE INCLUDING ESTIMATES, DETAILING, AND TAKE-OFFS USING ARTIFICIAL INTELLIGENCE

1. TECHNICAL FIELD

The present technology relates to improvements in and relating to plans. In particular, the present disclosure relates to systems and methods for analysing plans for building construction using Artificial Intelligence (AI). The technology may find particular application in the analysis of architectural plans, including quantity surveying and providing estimates. However, this should not be seen as limiting on the present technology.

2. BACKGROUND ART

In the construction industry it is necessary to provide building estimates which are accurate in a timely manner. These estimates consist of a detailed breakdown of each of the components of a build, including the materials, quantities and specifications required to construct the building together with an estimate of the cost to construct the building.

Building estimations are typically conducted by skilled quantity surveyors based on architectural or building plans. These plans are highly complex two-dimensional drawings containing complex image and text elements which can span 50 pages or more. The expert quantity surveyor must be able to distinguish between similar objects on the drawings based on their context, even where there are inconsistencies between how the objects are shown. Furthermore, the drawings are often provided in a greyscale form such as a PDF document. These documents can lack visual depth as objects and symbols can be in close proximity to one another or in some cases overlapping, accordingly it requires an experienced surveyor to make sense of this cluttered information and provide an accurate estimate.

Due to the complexity and skill required, the process of providing a building estimate can take a week or more to complete and can have a significant cost. This delay slows the construction planning process which is undesirable. There is also a risk that due to human error, the estimate is inaccurate which can have severe financial implications, such as loss of contract due to over-estimation or loss of profits due to underestimation. In most cases an error margin of 1-2% or less is required.

3. SUMMARY

It is an object of the present disclosure to address one or more of the foregoing problems or at least to provide the public with a useful choice.

All references, including any patents or patent applications cited in this specification are hereby incorporated by reference. No admission is made that any reference constitutes prior art. The discussion of the references states what their authors assert, and the applicants reserve the right to challenge the accuracy and pertinency of the cited documents. It will be clearly understood that, although a number of prior art publications are referred to herein, this reference does not constitute an admission that any of these documents form part of the common general knowledge in the art, in New Zealand or in any other country.

Throughout this specification, the word "comprise", or variations thereof such as "comprises" or "comprising", will be understood to imply the inclusion of a stated element, integer or step, or group of elements integers or steps, but not the exclusion of any other element, integer or step, or group of elements, integers or steps.

Further aspects and advantages of the present disclosure will become apparent from the ensuing description which is given by way of example only.

4. BRIEF DESCRIPTION OF THE DRAWINGS

Further aspects of the present technology will become apparent from the ensuing description which is given by way of example only and with reference to the accompanying drawings in which:

FIG. 5A shows a high-level flow diagram of a GAN aggregation module in accordance with some embodiments;

FIG. 5B shows an example of using a plurality of GANs to determine whether the features, and objects on the plan match the expected trained features according to some embodiments;

FIG. 1013 shows the wall objects of the architectural plan of FIG. 10A according to some embodiments;

5. DEFINITIONS

Figure 1A:
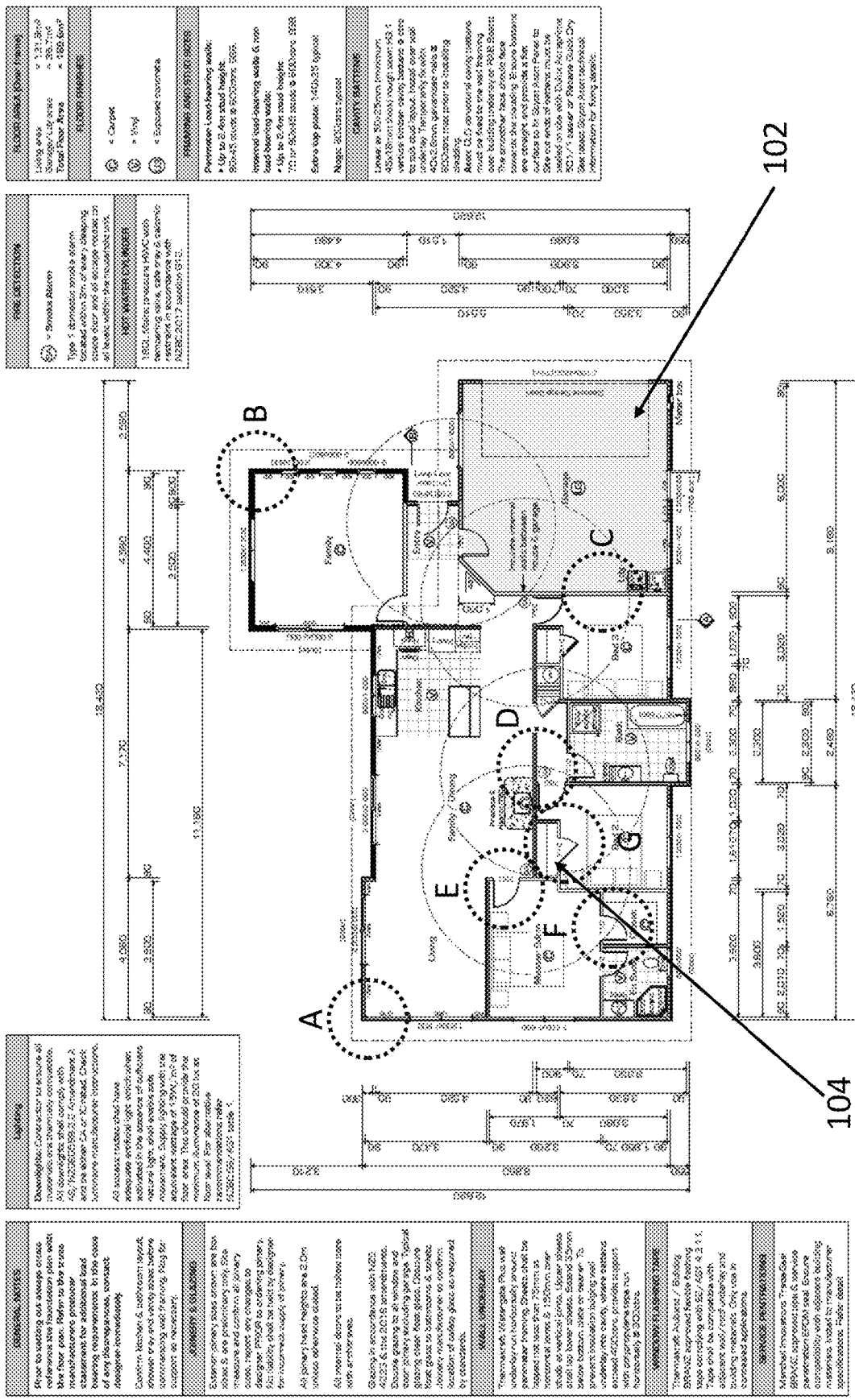
FIG. 1A shows an example page of an architectural plan according to some embodiments.

The foregoing definitions are intended to provide guidance to a reader, as to the meanings of terms used within the specification. However, the foregoing should not be seen as limiting in any way.

The present disclosure refers to 'plans for building construction', 'architectural plans', 'building plans', 'construction plans' or simply 'plans'. These terms can include any applicable plan within the construction industry, including but not limited to engineering drawings, blueprints, schematics, electrical plans, furnishing and equipment plans, wiring diagrams, plumbing plans, framing plans, floor plans and roof plans. It should also be appreciated that references to the construction industry can include both residential and commercial buildings. Furthermore, reference to 'plans for building construction' can relate to real-world plans which have the corresponding level of detail and complexity expected from these types of plans. These can include compliant plans, i.e. plans which either have the sufficient level of detail required to obtain compliance, or plans which already have compliance, however the technology, also works on non-compliant plans. This differentiates the present technology over some examples of the prior art discussed herein which have been developed and trained on highly simplified drawings, which are not representative of real-world plans, have insufficient detail to obtain compliance, and are not suitable for building construction.

The present disclosure refers to a process of measuring objects, features and areas on plans for building construction. This process can include all of the necessary measurements required to produce an estimate, including by not limited to measurement of scale, dimensions, materials, counts, building specification etc.

The present disclosure refers to 'estimations', 'costed estimates', 'building estimates' and 'construction estimates'. These terms can include quantity surveying, takeoffs (sometimes referred to as take-offs), material takeoffs, quantity takeoffs, drafting, and detailing. The output of the estimation process can include an estimate, bill of materials, job, costing, bid, or quote etc. In some applications the estimate can result in a 3D rendering of the build, or a BIM model for the construction. These terms should be familiar to those skilled in the art but for sake of completeness, an estimation includes an accurate account (identification) of the materials required, their measurements, the number/count of each and price. This process requires a detailed understanding of the building, engineering and regional specifications, to ensure that the estimate is an accurate representation of the build.

The present disclosure refers to 'confidence', 'confidence levels' and 'confidence thresholds' primarily in the context of object classification. These concepts should be familiar to those skilled in the art, however, use of the term confidence should not be seen as limiting on the present disclosure. It should be understood the term confidence may include an assessment of: accuracy, recall, sensitivity, precision, decision thresholds, probability, uncertainty, boolean logic, rules, and calculations. Similarly, while the confidence levels and thresholds are expressed in terms of percentages, this should not be seen as limiting on the technology, and in other examples the confidence and associated thresholds may be represented using any appropriate numeric or binary value, description, score, equation, mathematically oriented or generated number or value, or set of expressions.

The present technology employs highly sophisticated artificial intelligence (AI) technologies. Accordingly, the reader should be familiar with terms such as:

Neural Network: In the context of AI a neural network or deep neural network can include an interconnected group of artificial neurons forming a model that uses a mathematical or logic or other decision based computational model for information processing, based on a connentionistic and learned approach to computation.

Feature vector: Feature vectors are n-dimensional vectors (i.e. numeric values) representing the characteristic features of an object as a point or address in a multi-dimensional feature vector space (i.e., a feature vector space model). For example, the characteristic features can include aspects of the objects in the plan which help identify, define or provide information about the object, these may include such things as the dimensions, shape, colour, contrast, line weight, and relative positioning of elements within the object. In the present technology, these characteristic features are identified and converted to feature vectors using a process called vectorisation (or vectorization). The set of feature vectors comprises a feature space or feature vector space.

Feature vector space: a n-dimensional space model comprising a plurality of feature vectors. The feature vector space can be used in the present technology to determine the similarity between new, unseen feature vectors, and existing feature vectors within the feature vector space. In this way, objects can be classified with varying degrees of classification confidence based on how closely they match known feature vectors within the feature vector space.

Vectorisation: The process of identifying and converting the characteristic features of an object, image or text into numerical values (i.e. vectors) representative of the object for use in a computational model.

Objects: In the context of the present specification, objects or "architectural objects" can include any information which can be identified on an architectural plan. This can include human identifiable features such as the architectural symbols representative of trees, bathrooms, doors, stairs, windows, floor finishes, walls, framing, trusses etc. as well as more abstract concepts, such as segments of these architectural symbols, or features which overlap on the plans. In the context of the present disclosure, the objects can include the lines (including dashed and dotted lines) which define internal or external walls, property boundaries, easements, footpaths, rooflines, dimensions etc. shading, and patterns, text and any other element of an architectural plan which the present technology may be configured to identify.

Throughout the present specification, reference to 'low-level' vector spaces can include a vector space which comprises granular features about a plan, or details and information associated with the objects on the plan comprising but in no way limited to: granular characteristic features, including shape, length, shading, thickness, patterns, symbols, overlap, underlying calculations, other identifiable characteristics on a pixel by pixel basis. It should be appreciated that the low-level features may include features which are determined to be relevant by the artificial intelligence algorithms described herein, even where those features would not be considered relevant to a human observer.

Throughout the present specification, reference to 'high-level' vector spaces can include a vector space which comprises high-level concepts or information about a plan typically relevant to a human observer. This information is also herein referred to as 'high-level representations'. The information contained within the high-level vector spaces comprises, but is in no way limited to: groupings of low-level vectors or objects, meta information, rooms, materials, objects, structure, components for frames, floors, roofs, rules regarding object placement or building standards, engineering or physics requirements, architectural concepts.

The term 'Engineering Physics' should be understood to refer to the combined disciplines of engineering, physics and math as applied to the construction industry.

6. DETAILED DESCRIPTION

According to one aspect of the technology there are provided systems and methods for providing estimates using technologies trained using artificial intelligence.

According to another aspect of the technology, there are provided systems and methods for providing estimates from plans for building construction using technologies trained using artificial intelligence.

According to another aspect of the technology, there are provided systems and methods for identifying objects on plans for building construction using a processor configured to execute one or more object detection and recognition algorithms, whereby the algorithms are trained using machine learning.

According to another aspect of the technology, there are provided systems and methods of segmenting areas or objects on a plan for building construction, using a processor configured to execute one or more semantic segmentation algorithms configured to detect segment areas or objects on the building construction plan, whereby the algorithms are trained using machine learning.

According to another aspect of the technology, there are provided systems and methods of recognising and interpreting text on a plan for building construction, using a processor configured to execute one or more text recognition algorithms configured to detect and interpret text on the plan for building construction, whereby the algorithms are trained using machine learning.

According to another aspect of the technology, there are provided systems and methods of generating plans for building construction using a processor configured to run at least one generative adversarial network, wherein the generative adversarial network is configured to generate plans for building construction or subcomponents of building construction plans.

According to another aspect of the technology, there are provided systems and methods for improving the quality of a plan for building construction by using one or more generative adversarial networks to generate replacement features of the plan for building construction.

According to another aspect of the technology, there is provided a processing system, comprising:
  an input system configured to receive a plan for building construction;
  one or more processors configured to process the plan once received by the input system; and
  an output system configured to output information about the plan,
  wherein the one or more processors are configured to perform:
    pre-processing of the architectural plan, where the pre-processing consists of performing one or more of object detection and recognition, semantic segmentation, and text recognition to identify a plurality of objects on the plan,
    vectorisation of the characteristic features of the detected objects to convert said characteristic features to a feature vector space, and
    comparison of the feature vector space for the detected objects with a learned feature vector space to determine a confidence level for the classification of each detected object, and
    analysis of the characteristic features for objects that meet a pre-determined confidence level,
  and wherein, the output system is configured to use the analysis of the characteristic feature(s) to provide output information about the plan.

In an example, the processing system may be configured to receive an electronic document containing the plan. For example, the electronic document may be a PDF file, image, plurality of images or file containing a plurality of images.

In an example, the plan for building construction may be a real-world building plan, such as a compliant building plan. Is should be appreciated that compliant building plans generally describe plans which meet engineering and other national and local regulatory requirements for construction in any given territory. This includes different countries, regions or states within a country.

In an example, the pre-processing may include page identification to determine the type of information shown on each page of the plan, and detection of objects on the plan using object detection and recognition algorithms, semantic segmentation algorithms or text recognition algorithms. For example, the object detection and recognition algorithms may include one or more of adaptive thresholding, thresholding regions based on intensity using rule based and goal based centric clustering, shape analytical techniques, mathematical morphology methods, region based convolutional neural networks, YOLO ('You only look once') or SSD ('Single Shot Detector') algorithms. The semantic segmentation algorithms may include one or more of YOLO algorithms, YOLACT ('You Only Look at Coefficients') algorithms, SSD algorithms, CNN ('Convolutional Neural Networks') configured to perform pixel-by-pixel classification of each pixel in the image, FCN ('Fully Convolutional Networks') trained for image segmentation, and Mask R-CNN ('Region based Convolutional Neural Networks'). The text recognition algorithms may include one or more of RNN ('Recurrent Neural Networks') configured to process variable length sequences of text, LSTM ('Long Short-Term Memory') to process sequences of images or text, and NLP ('Natural Language Processing') algorithms such as Word2Vec.

In an example, the algorithms may be trained using one or more machine learning approaches including: supervised learning, unsupervised learning, semi-supervised learning, transfer learning, and reinforcement learning.

In an example, the algorithms are trained using training data which may be generated using a generative adversarial network (GAN).

In an example, the vectorisation of the detected objects may be performed using a feature vector space or hierarchical machine learning model, including similarity detection models. For example, the vectorisation of the detected objects may be performed using a one-shot, zero-shot or few-shot learning process.

In an example, the learned feature vector space may be generated using a machine learning technique.

In an example, the learned feature vector space may be trained using one or more machine learning approaches including: supervised learning, unsupervised learning, semi-supervised learning, transfer learning, and reinforcement learning.

In an example, the object feature vectors may be provided to a knowledge representation and linkage module configured to perform ensemble fuzzy matching to generate high-level representations about the plan.

In an example, the knowledge representation and linkage module is configured to provide additional information about the object by applying one or more of: architectural logic, engineering physics, engineering specifications, building code, country specific knowledge, climate specific knowledge.

In an example, the high-level representations comprise one or more linked object feature vectors.

In an example, the confidence level may be compared against one or more adjustable thresholds to determine the likelihood of correct classification. For example, separate thresholds may be used depending on the type of object being classified, such as a first threshold for hinged doors, and a second threshold for cavity doors. In some examples, the one or more thresholds may be self-adapting. For example, the thresholds may increase or decrease as the number of related vectors in the feature vector space increases. In other examples the thresholds may be manually adapted, such as when a user gains confidence in the one or more processor(s) ability to classify certain types of object correctly.

In an example, when the confidence level is below the one or more adjustable thresholds, the object vector may be sent to a human for review.

In an example, the object vector may be passed to a human for review when the object vector conflicts with one or more other pieces of information.

In an example, the object vector may be passed to a human for review to check for concept drift.

In an example, the human may be tasked to correct, amend, revise, incorporate, or remove the new object vector in the feature vector space and/or corresponding high-level representation.

In an example, following review of the object vector, the learned feature vector space and/or their associated models may be updated.

In an example, the analysis may comprise any one or more of pixel counting, classified object counting or text recognition.

In an example, the output information may comprise one or more of object identification, object counts, scale, dimensions, locations, engineering specifications, and materials.

In an example, the output information may be compared against one or more material database(s) to determine the materials to be used.

In an example, the materials may be compared against one or more supplier database(s) to provide a costed estimate.

In an example, the output information may be used to generate a computer-aided design (CAD) or Building Information Modelling (BIM) file. For example, a 2D CAD file, a 3D CAD file, IFC, RVT, NWD, DWG or DXF file.

In an example, the output information may be compared against a repository of plans for building construction to identify the plans which most closely match the processed plan for building construction.

In an example, the output information may be compared against information from another plan for building construction in order to identify differences between the plans. For example, the differences may be shown using a marked-up version of the plan on a user interface, wherein the marked-up version is configured to highlight the differences in the plans.

In an example, the output information may be used to generate a Building Information Modelling (BIM) file. For example, the output information may be converted to an appropriate electronic document such as an IFC, DWG or DXF file, as should be known to those skilled in the art. However, the foregoing should not be seen as limiting on the technology.

In an example, the output information may be provided to a software package configured for visualisation, review and/or project management purposes. For example, the software package may be a third-party software package, such as those which should be familiar to those skilled in the art.

In an example, the output information may be provided to a software package via one or more of: an electronic file (such as an exported document), one or more Application Programming Interface (API), File Transfer Protocol (FTP), or Cloud-based document sharing facility.

According to another aspect of the technology, there is provided a computer implemented AI method of processing a plan for building construction, comprising the steps of:
  a) providing the plan to an input system;
  b) pre-processing of the plan, where the pre-processing consists of performing one or more of object detection and recognition, semantic segmentation, and text recognition to identify a plurality of objects on the plan;
  c) vectorising the characteristic features of the objects to form a feature vector space;
  d) comparing the feature vector space against a learned feature vector space to determine a confidence level for the classification of each detected object; and
  e) analysing the characteristic features for objects that meet a pre-determined confidence level to determine one or more items or materials required to construct the building.

It should be appreciated that while reference designators are provided to the method steps herein, this should not be seen as limiting on the order in which the method steps are performed, and in some cases the above steps may be performed in any order as should be understood by those skilled in the art. Furthermore, use of a designator does not imply that the step labelled with the preceding designator must be used. In other words, by way of example, step i) may be performed with or without steps f), g) or h).

In an example, the plan for building construction may be a real-world building plan, such as a compliant building plan. Is should be appreciated that compliant building plans generally describe plans which meet engineering and other national and local regulatory requirements for construction in any given territory. This includes different countries, regions or states within a country.

In an example, the method may further comprise the step of: f) collating the one or more materials or object vectors to provide output information about the plan.

In an example, the output information in step f) may comprise one or more of object counts, scale, dimensions, locations, and materials.

In an example, the method may further comprise the step of: g) comparing the output information against one or more material database(s) to determine the materials to be used.

In an example, the method may further comprise the step of: h) comparing the materials against one or more supplier database(s) to provide a costed estimate.

In an example, the method may further comprise the step of: i) using the output information to generate a computer-aided design (CAD) file. For example, the output information may be used to generate a 2D or 3D CAD file.

In an example, the method may further comprise the step of: j) comparing the output information against a database to identify building construction plans which most closely match the processed building construction plan.

In an example, the method may further comprise the step of: k), comparing the output information against the information about another building construction plan in order to identify differences between the plans. For example, the differences may be shown using a marked-up version of the plan on a user interface, wherein the marked-up version is configured to highlight the differences in the plans.

In an example, the method may further comprise the step of: I) comparing the confidence level against one or more thresholds.

In an example, the method may further comprise the step of: m) performing one-shot learning if the confidence level is below the one or more thresholds.

In an example, the method may further comprise the step of: n) passing the object vector to a human for review if the confidence level is below the one or more thresholds.

In an example, the method under of a) may comprise the action of providing an electronic document which contains the plan. For example, the electronic document may be a PDF document, image, plurality of images, or a file containing a plurality of images.

In an example, the one or more object detection and recognition, semantic segmentation or text recognition algorithms may be trained using one or more machine learning approaches including: supervised learning, unsupervised learning, semi-supervised learning, transfer learning, and reinforcement learning.

In an example, the training data used to train the one or more algorithms, may be generated using a generative adversarial network (GAN).

In an example, the method of step c) may comprise vectorisation of the detected objects using a feature vector space or hierarchical machine learning model. For example, the vectorisation may be performed using a one-shot learning process.

In an example the learned feature vector space may be generated using a machine learning technique. For example, the learned feature vector space may be trained using one or more machine learning approaches including: supervised learning, unsupervised learning, semi-supervised learning, transfer learning, and reinforcement learning.

In an example, the method may further comprise the step of: o) comparing the confidence level against one or more thresholds to determine the likelihood of correct classification.

In an example, the method may further comprise the step of: p) if the confidence level is below the one or more thresholds, passing the object vector to a human for review.

In an example, the method may further comprise the step of: q) performing the analysis using at least one of, pixel counting, classified object counting, or text recognition.

In an example, the method may further comprise the step of: r) using the output information to generate a Building Information Modelling (BIM) file. For example, the output information may be converted to an appropriate electronic document such as an IFC, DWG or DXF file, as should be known to those skilled in the art. However, the foregoing should not be seen as limiting on the technology.

In an example, the method may further comprise the step of: s) providing the output information to a software package configured for visualisation, review and/or project management purposes. For example, the software package may be a third-party software package, such as those which should be familiar to those skilled in the art.

In an example, the method may provide the output information via one or more of: an electronic file (such as an exported document), one or more Application Programming Interface (API), File Transfer Protocol (FTP), or Cloud-based document sharing facility.

In a further aspect of the technology, there is provided a computer implemented AI method for preparing a cost estimate from a plan for building construction (plan) comprising the steps of:
a) accessing a learned feature vector space of plans for building construction, said feature vector space containing feature vectors for a plurality of plans and/or vectors from a plurality of object vectors;
b) vectorising the plan to create new feature space vectors;
c) comparing the new feature space vectors from the plan to the learned feature vector space and using one or more one-shot, zero-shot or few-shot algorithm(s) to recognise the objects in the plan; and
d) analysing the recognised objects to determine the items/materials required for constructing the building.

In an example, the method may further comprise the step of: e) accessing one or more product supplier databases to match the items/materials against products.

In an example, the method may further comprise the step of: f) accessing one or more pricing databases to match the products against the prices in order to provide the cost estimate.

In a still further aspect of the technology, there is provided a computer implemented AI method for preparing a cost estimate from a real-world architectural plan for building construction, comprising:
a) accessing a learned feature vector space of real-world architectural plans for building construction, said feature vector space comprising at least one of feature vectors for a plurality of real-world architectural plans or vectors from a plurality of object vectors;
b) vectorising a real-world architectural plan to create new feature space vectors;
c) comparing the new feature space vectors from the real-world architectural plan to the learned feature vector space and using one or more one-shot, zero-shot or few-shot algorithm(s) to recognise the objects in the real-world architectural plan;
d) analysing the recognised objects to determine the items/materials required for constructing the building and the costs of said items/materials; and
e) providing within 1-12 hours of step b) one or more of:
i) a cost estimate,
ii) construction detailing, or
iii) a building take-off.

In an example, the recognised objects may be measured prior to step e).

In an example, any objects unable to be recognised in step c) may be referred to a human for review.

In an example, when new vectors are created through the vectorisation process, these new vectors may be added to the learned feature vector space.

According to a yet further aspect of the technology, there is provided a computer implemented AI method for obtaining a cost estimate from a new plan for building construction comprising the steps of:
- a) accessing an evolving feature vector space cataloguing different features of objects found on building plans wherein the objects are sourced from at least 10,000 different plans for building construction;
- b) using machine learning algorithms to compare objects from the new building plan against the feature vector space to recognise the objects with an assigned level of confidence; and
- c) analysing the recognised objects that meet a pre-determined confidence level.

In an example, the method may further comprise the step of: d) comparing the recognised objects against one or more product supplier databases to match the objects to products.

In an example, the method may further comprise the step of: e) accessing one or more pricing databases to match the products against the prices in order to provide the cost estimate.

In an example, any objects unable to be recognised in step c) may be referred to a human for review.

In an example, as the objects are recognised, they may be added to the feature vector space.

According to a yet further aspect of the technology, there is provided a computer implemented AI method for obtaining a cost estimate from a new plan for building construction comprising the steps of:
- a) analysing the new building plan using a combination of one-shot learning and machine learning algorithms in order to recognise a plurality of objects on the plan;
- b) determining a confidence level for the recognition of the plurality of objects; and
- c) analysing the recognised objects that meet a pre-determined confidence level.

In an example, the method may further comprise the step of: d) comparing the recognised objects against one or more product supplier databases to match the objects to products.

In an example, the method may further comprise the step of: e) accessing one or more pricing databases to match the products against the prices in order to provide the cost estimate.

In an example, the method may further comprise the step of: f) providing the object to a human for review if the confidence level is below a pre-determined threshold.

In an example, as the objects are recognised, the machine learning models may be updated.

The present technology may provide a number of advantages as should be apparent to those skilled in the art including but not limited to one or more of the following:
- Improving the ability of computers to accurately process complex technical drawings such as architectural plans;
- Providing human-augmented systems and methods of accounting for unseen objects and concept drift in machine learning models;
- Providing the construction industry with faster turn-around, more accurate analysis of architectural plans;
- Allowing for fast comparison of architectural plans against similar architectural plans based on any desired parameter, such as total floor area, style, materials etc.
- Allowing for detailed image processing not possible using conventional computing techniques; Providing methods and systems for reducing human error in providing building estimates;
- Allowing for more responsive feedback on cost, material and design implications resulting from changes to architectural plans; and
- The ability for a computer to synthesise data-rich CAD or BIM documents from flat, two-dimensional drawings, in a way which was not previously possible.

6.1. Overview of Estimation Techniques

FIG. 1 shows an example page of a plan for building construction 100 as defined herein. These plans 100 are complex, information dense documents which can span 50 pages or more. For sake of simplicity the foregoing refers to these building plans as architectural plans or simply "plans" 100.

The architectural plan 100 shown in FIG. 1 can include a wide range of objects which provide information about the building on the plan, and the land around the building. These objects comprise, but not limited to:

Architectural symbols. These are the symbols which define objects such as trees, bathrooms, doors, stairs, windows, floor finishes, etc.

Lines, including solid, hollow, dashed and dotted lines. These define features such as internal or external walls, property boundaries, easements, footpaths, rooflines, dimensions etc.

Shading, and patterns. These are used to show certain materials, or areas on the plan.

Text, which indicates the purposes of the rooms, dimensions, features, construction methods, regulatory standards etc.

Figure 1B:
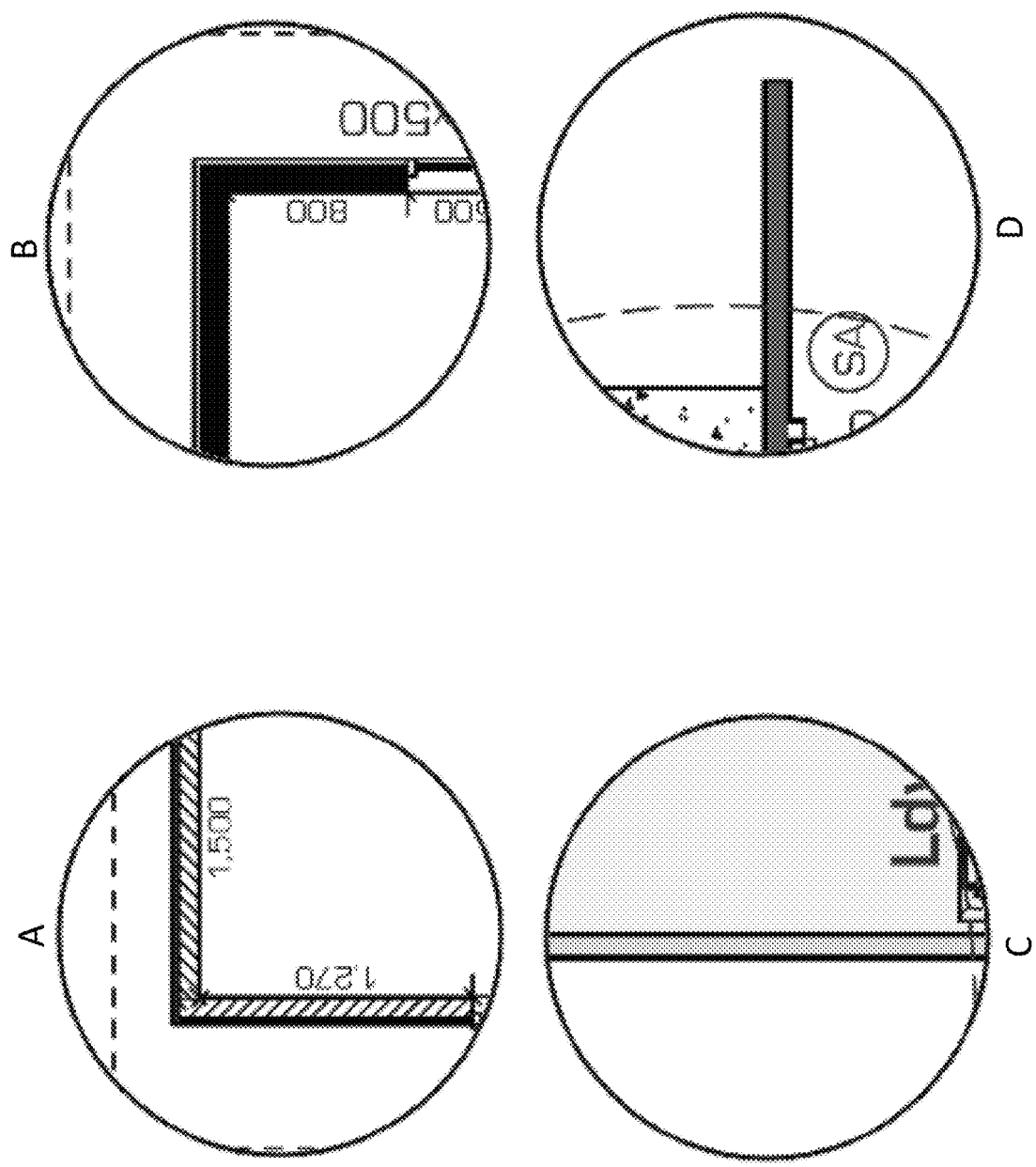
FIG. 1B shows close-up views of wall sections of the architectural plan of FIG. 1A according to some embodiments.

In the example of FIG. 1A, lines are used to represent internal walls, external walls, windows, doors, stairs, etc. In other examples, lines may depict dimensions, or define boundaries of driveways, rights of way, easements, paving stones, boundaries, landscaping, dimensions, water, power and drainage features. All of this detail is obtained using variations in line thickness, dimensions, shape, dashing, hatching, shading and patterns. In addition, text may often be used near these lines to give further details about what is being represented.

As also shown in FIG. 1A text describing features of the plan can also be located in Tables, or in other areas on the plan, remote from the objects to which they relate. This text often being a required for compliant plans.

Unfortunately, the ways in which objects can be represented on architectural plans is highly variable and there is no consistent approach between different architects and drafts people. For example, a single wall can be drawn in a number of different ways, such as using an empty rectangle, a filled rectangle, or individual lines creating a rectangle.

The example of FIG. 1A includes various examples of walls including the features indicated by circles A, B, C and D. These features have been expanded in FIG. 1B for comparison.

Figure 1C:
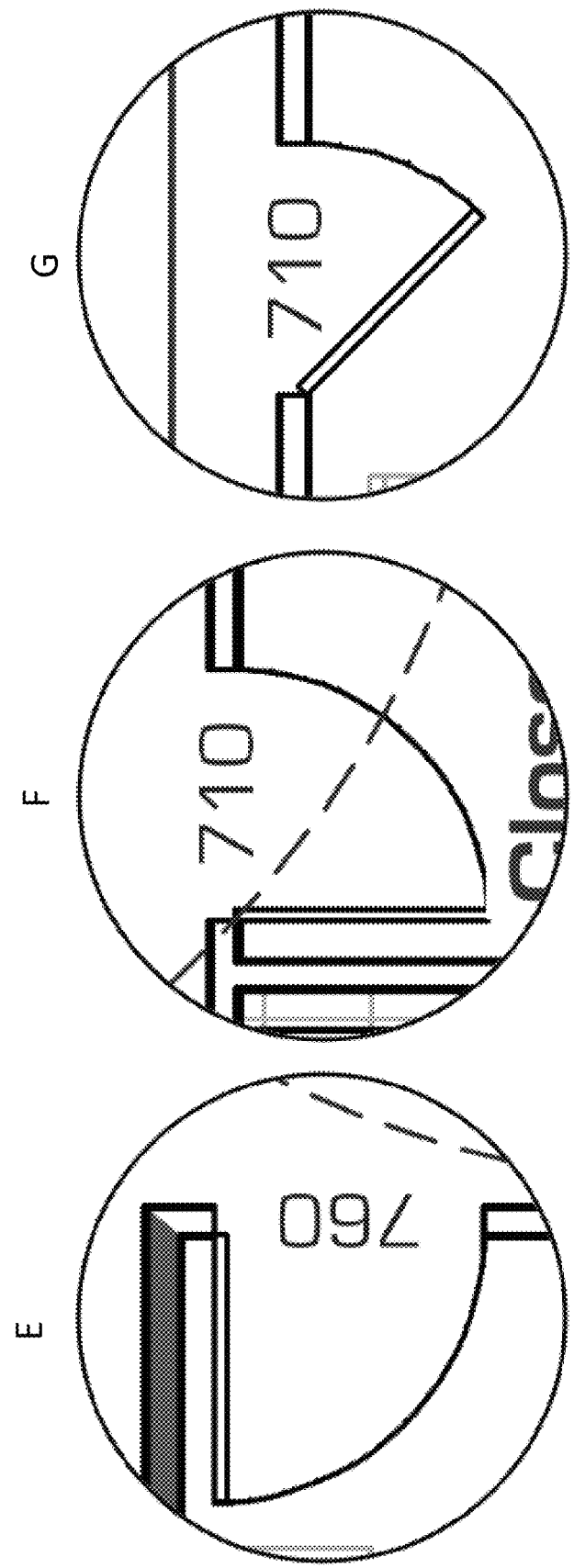
FIG. 1C shows close-up views of doors of the architectural plan of FIG. 1A according to some embodiments.

Similarly, with reference to FIG. 1C it can be seen that objects such as doors can be represented in a number of different ways. For example, features F and G represent the same type and size of door but are drawn in different ways. Conversely features E and F are drawn in the same manner (albeit rotated) however represent different sizes of doors. Accordingly, there is a need to associate the dimensional text with the door itself.

In many cases similar symbols are used to mean different things depending on their location and context within the architectural plan.

Another complication is that the objects, including symbols, lines, text and shading in the architectural plans often overlap one another. It can therefore be difficult to determine the exact start and end points of any particular object.

The text including on the plans also includes various font sizes, rotations and thickness as well as acronyms or shorthand for various features. The relative positioning of this text with respect to other objects and symbols can also greatly impact the context and meaning of the text. Accordingly, to fully understand an architectural plan, each piece of text must be considered in the context of the document as a whole (which can span 50 pages or more).

A further complication is that the architectural plans 100 are typically provided as an electronic document with minimal visual depth, such as a greyscale PDF document, image or series of images. It should be appreciated that these documents are generally not information rich Computer-Aided Design (CAD) file, but are rather flat images. Therefore, there is typically little visual depth or distinguishing features to assist someone (or a computer) in understanding the information presented. In other fields of computer vision, such as facial recognition, the algorithms can often use colour, depth or shapes as a source of rich visual clues, this is useful as another data point for training the AI. Unfortunately, the use of colour is uncommon on architectural plans.

In addition to the information written on the drawing, there is often information which can be inferred from the context. For example, in FIG. 1A it is possible to identify features such as the garage 102 due to the shading used, and wardrobes 104, due to their sizes and relative positioning on the plan.

There is also further information which can be obtained by knowing the country, climate conditions, regulations or material availability in the area of the build. As these can often influence the construction of the building. Some of this information can be obtained by analysing, processing and understanding the text around the periphery of the architectural plan. However, this is not always the case.

Accordingly, interpretation of an architectural plan requires highly skilled architects or quantity surveyors with years of experience, and knowledge of specific geographical areas and the aforementioned nuances associated with same. Efforts have been made to at least partially automate the analysis of architectural plans. However, the inventors have tested these technologies on real-world plans for building construction and note that no existing technologies are able to provide an accurate breakdown or summary of the objects on the plan. The existing technologies often miss elements or, misclassify features requiring significant oversight from skilled architects or quantity surveyors.

These existing technologies as explained below have been developed to work on highly simplified mock plans, which lack the required detail for actual building construction or compliance. These mock plans are generally consistent in their use of symbols and text, such as the example shown in FIG. 2. At present there are no solutions which can analyse real-world architectural plans as aforementioned to the level margin of error required to provide a completed building estimate to a commercial standard.

The present technology looks to overcome these shortcomings as described herein.

6.2. Overview of Automated Architectural Plan Analysis Techniques

The inventors have considered the leading research and off-the-shelf solutions to automating architectural plan analysis, including but not limited to: Deep Floor Plan, Naver Floor Plan, CubiCasa 5K, Floor Plan Analysis System, Multi-unit Architectural Floor Plans, Generating Conceptual Design from Arch Plans and Graph2Plan.

None of these technologies were able to accurately analyse real-world plans for building construction, otherwise referred to as compliant, or real-world architectural floor plans such as those shown in FIG. 1.

For example, published accuracy for Deep Floor Plan, is as low as 49% for some objects and features on relatively simple architectural plans. See for example:

Zhiliang Z, Xianzhi L, Ying K, Chi-Wing F, 29 Aug. 2019, 'Deep Floor Plan Recognition Using a Multi-Task Network with Room-Boundary-Guided Attention' arXiv: 1907.11025 available at https://arxiv.org/abs/1908.11025.

Some systems were able to identify the structure of some components such as walls, doors and windows. However, this could not be done consistently, was prone to errors and simply ignored the majority of the information present on the architectural plan. It is believed that this is due to these technologies using less complex processing strategies, and the fact that they have designed and trained to distinguish features on highly simplified data sets.

Figure 2:
FIG. 2 shows an example of a simplified non-compliant architectural plan used for prior art machine learning according to some embodiments.

FIG. 2 shows one example of a highly simplified (non-compliant, or mock) architectural plan. Note that in contrast to FIG. 1, FIG. 2 has minimal object overlap, much lower object density and clutter, less object adjacency and greater differentiation between objects such as windows and external walls. There also appears to be a greater consistency of object representations within these simplified public datasets, which is uncommon in real-world examples of architectural plans. Accordingly, the systems in the art are unable to be generalised for processing real-world plans (including compliant plans) for building construction or cope with variation between different architects or drafts people. These systems therefore require significant human input in order to be used for architectural plan analysis or estimation.

From a practical standpoint, there is little to no availability of usable real-world architectural plans which could be used to train an AI, let alone any accurately architectural plans containing accurately labelled data for the purposes of supervised machine learning. While data could theoretically be created for this purpose, this would be uneconomical, and take significant amounts of time to generate a meaningful amount of data.

Furthermore, there is a risk that any labelled architectural plans include mistakes, and therefore even if plans were available, they would likely need an expert to review for accuracy before being used to train an AI.

6.3. Overview of Certain Embodiments

Some embodiments look to overcome the shortcomings in the art by:

Performing pre-processing of the architectural plan, including using object detection and recognition algorithms, semantic segmentation algorithms and/or text recognition algorithms in order to extract as much data as possible for downstream processing by systems and algorithms described herein.

Using generative adversarial networks (GANs) for generating meaningful training data for the pre-processing algorithms.

Using one-shot learning or hierarchical zero systems, to quickly and accurately process the information. Including identifying any new symbols or objects not previously seen.

Linking the information to provide a fully featured representation of the information in order to enable fast accurate estimations and comparisons between architectural plans.

Including human-in-the-loop (HITL) approaches to ensuring that previously unknown objects, symbols and text are accurately coded, and fed back into the feature vector spaces, enabling automated detection of these features going forward. Use of human in the loop review can also be used to prevent unintended concept drift or error accumulation in the algorithms used.

Figure 3:
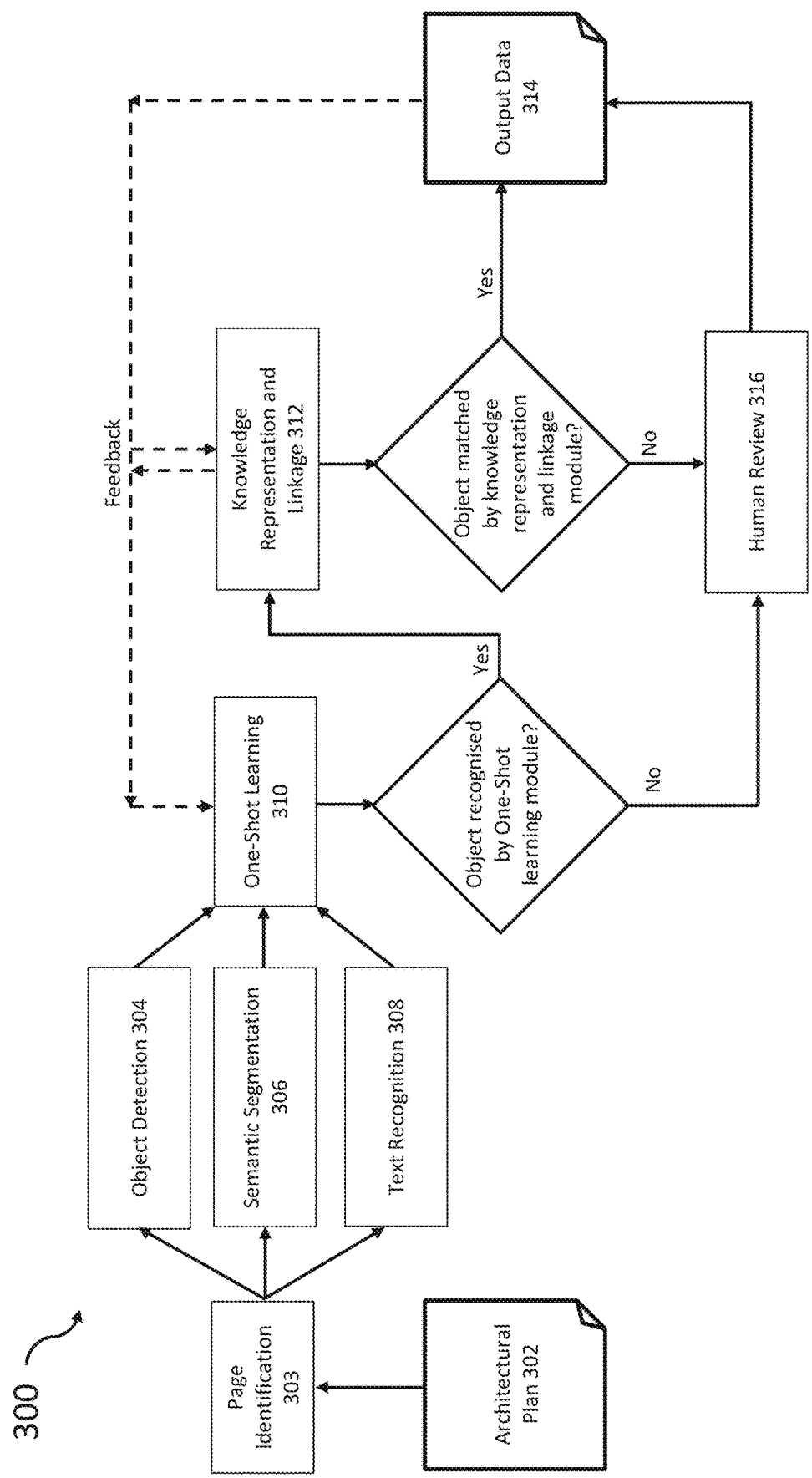
FIG. 3 shows a high-level flow diagram of one embodiment of the present technology.

FIG. 3 shows an overview of an architectural plan processing system 300 according to the present technology.

The architectural plan processing system 300 comprises an input system (not shown) which is configured to receive the architectural plan 302. In some examples of the technology, the architectural plan 302 may be provided as a file stored on a computer storage medium such as a hard drive, solid-state storage drive, removable storage medium, or cloud storage service. In other examples of the technology, the input system may include one or more devices for receiving the architectural plan 302, such as a document scanner or camera.

In the examples described herein, the architectural plan is provided as a portable document format (PDF) file. However, this should not be seen as limiting on the technology, and in other examples, Computer-Aided Design (CAD) files or image files such as Portable graphics Format (PNG) or Joint Photographic Experts Group (JPEG) may be used.

Once the architectural plan 302 has been received, one or more processing steps are performed. These processing steps are performed on at least one processor, such as a desktop, laptop, portable device or cloud-based processor. In some examples, the processing steps may be performed across a plurality of processors to speed up the processing of the architectural plan.

The present technology provides four pre-processing steps which may be performed, including page identification 303, object detection and recognition 304, semantic segmentation 306 and text recognition 308. It should be appreciated, that in some examples of the technology, only one or two of these processing steps may be performed. For example, text recognition 308 may not be required on architectural plans which have no text. In other examples, all three processing steps are performed.

These pre-processing steps may be performed in parallel or sequentially. However, in some cases it may be advantageous to perform page identification 303 in advance of object detection and recognition 304, semantic segmentation 306 and text recognition 308, as the page identification may inform the decisions as to which pre-processing algorithms should be used.

The identified objects from the processing steps are provided to a one-shot learning 310 process which is tasked with converting the characteristic features of the objects (including segments and text) into feature vector space representations (vectorisation). This is ideally done through a feature vector space or hierarchical machine learning model as part of the one-shot learning process. For example, a machine learning based similarity detection algorithm may be used. These feature vector space representations include the characteristic features of the objects detected on the architectural plan 302 including the materials used (i.e. timber, brick, stone, steel etc), measurements (i.e. sizes of walls/framing/windows etc, volume of materials required), locations/positions of the objects, details regarding openings, and spaces, counts (i.e. number of windows, doors, etc), and meta-data (such as climate-responsive architecture which in turn implies the use of particular design patterns/materials, energy-related features within a sustainable architecture context, or broader architectural and engineering specifications).

The objects and features are also measured and quantified for the purposes of providing estimates.

The feature vector space representations are then provided to a knowledge representation and linkage module 312 as inputs. The knowledge representation and linkage module 312 is tasked with forming a unique unified representation of every combination of inputs provided, this again is a form of vectorisation as defined herein. This includes determining, for each input what the confidence is that each feature identified on the architectural plan has been correctly classified, and for expanding upon the knowledge about the architectural plan, for example by grouping related feature vectors together to form rooms, inferring missing features or confirming features by using engineering knowledge, applicable building codes, compliance rules, as well as knowledge about materials, architectural physics, engineering physics, loading, angles, bracing etc.

In this way the knowledge representation and linkage module can create a more complete picture of the plan for building construction, by combining the knowledge about the detected objects with more general knowledge about how buildings are constructed, what features or logic are necessary, what features are likely to be present based on the applicable building codes etc.

The knowledge representation and linkage module also looks for correlations between the feature vectors generated by the one-shot learning module, this can include linking dimensions to objects, text to rooms, objects to rooms, such as cars to garages, ovens to kitchens etc.

Accordingly, the knowledge representation and linkage module is able to detect instances where an object is not expected to be in a given location on a plan, and flag these unexpected placements for human review. Examples might include multiple doors in close proximity to one another, windows on internal walls, furniture which is adjacent to unrelated furniture (such as a table in a bathroom) etc.

This knowledge representation and linkage may be performed using a fuzzy matching algorithm, as is described herein.

The knowledge representation and linkage module also provides output data 314 which summarises the quantifiable characteristics of the objects identified on the architectural plan. In one example of the technology, this is a full breakdown of the items and materials used including lengths, counts, locations and volumes of each item. The quantifiable characteristics can then be compared against a supplier database of products in order to determine the products required to construct the building, and a material cost database to determine the costs of the products. In this way, the present technology can be used to provide an estimate as defined herein. In other examples, the output data 314 can be compared against a previous set of output data 314 to quickly and easily determine what the impact will be due to any changes to a previously analysed architectural plan.

In other examples of the technology, the output data 314 from the knowledge representation and linkage module may be used to generate a three-dimensional model of the building from the two-dimensional architectural plan. These accurate three-dimensional models can accurately represent the dimensions, positions, materials and construction of the building.

In situations where the knowledge representation and linkage model 312 or one-shot learning module 310 are unable to classify or have a low level of confidence in their classification of any given object, this object along with any associated information may be provided to a human reviewer 316 to classify or add the required information. This human in the loop review can be used to further train the one-shot learning and knowledge representation and linkage algorithms by updating the respective vector spaces or adding or removing features to prevent concept drift. In this way, when similar features are detected in the future the one-shot learning module and knowledge representation and linkage module are able to more accurately identify, measure, or infer context relating to these features.

In one example, the processed output data 314 provides feedback to the knowledge representation and linkage module 312, as well as the one-shot learning module 310 so that these modules can adapt and improve over time. However, it should be appreciated that this is an optional feature, and when sufficient confidence is gained in the accuracy of the present technology, the model may be made static, so as to not continuously update.

While the foregoing examples are described in the context of fully automated architectural plan analysis and processing, this should not be seen as limiting on the technology. For example, the outputs of any stage of the architectural plan processing system 300 may be presented to a quantity surveyor for validation or to complete the estimation. Accordingly, the systems described herein can augment or assist a human with the analysis of architectural plans, and/or the process of providing estimates.

In another example, the information provided by the architectural plan processing system 300 can allow for the review and estimation process to be conducted by an individual without a quantity surveying background, qualification, or experience.

In a yet further example, the architectural plan processing system 300 may provide a completed estimate without requiring any human intervention or review.

It should be appreciated that the present technology cannot be performed without at least partial processing by a computer system (i.e. one or more processors configured to execute machine readable code, including one or more remote processors such as cloud-based processors). The techniques described herein use advanced deep learning technologies to identify characteristic features of objects at a level far beyond a human operator's capabilities. The inventors have also shown that traditional computer techniques and algorithms for object detection and recognition are not suitable for use on architectural plans, accordingly new technologies and combinations of technologies (as disclosed herein) have been developed to improve the computer's ability to accurately process the highly complex technical drawings.

While the present technology employs several concepts broadly known in the field of machine learning. There has been little, or no attempt made to optimise and combine these machine learning technologies in a way which allows the advanced image processing and recognition required for analysis of real-world architectural plans.

The present technology provides improvements in the ability of computers to process highly technical drawings such as architectural plans. In addition, human-augmented systems and methods are provided which allow for improvements to the computer systems to account for new, unseen objects and concept drift in machine learning models.

In addition to the technical advantages provided to the field of computer image processing and more specifically analysis of engineering drawings such as architectural plans, the present technology solves numerous real-world problems, and provides numerous real-world advantages such as:

- The ability to quickly (near instantaneously, or within a matter of minutes) provide a bill of materials for a build, and the associated costed estimate without the conventional three to four weeks of delay and input from highly skilled quantity surveyors. Reducing costs for the pre-build and compliance processes, enabling faster building construction, and helping to address global housing shortages. Reducing human error in providing building estimates, which could result in over or underestimating of build costs. The result is the ability to quickly produce estimates which are highly accurate (i.e. within 0-2% of actual costs).
- The ability to synthesise data-rich CAD or BIM documents from flat, two-dimensional drawings, in a way which was not previously possible. This allows for fast or instant creation of CAD, 3D BIM files and 3D BIM models, where these documents/models would otherwise not exist. The result is reduced turnaround time, cost and expertise requirements to prepare CAD or BIM models.
- Allowing for more responsive feedback on cost, material and design implications resulting from changes to architectural plans. This allows architects, builders, and customers to iterate through more design options quickly and get near instantaneous feedback on the cost, material, and time implications resulting from proposed changes. A result may include more dynamic customised building constructions, rather than the more traditional approach of selecting between a handful of popular styles.
- Allowing for fast comparison of architectural plans against similar architectural plans based on any desired parameter, such as total floor area, style, materials etc. While a comparison could be done manually between a couple of plans, it was not previously possible to quickly analyse thousands of plans quickly, accurately, and using any number of or combination of desired parameters.

These advantages provide numerous real-world benefits such as faster (near instantaneous), more accurate, cheaper analysis of building plans. Which in turn can result in lower-cost construction projects, faster building pre-planning, and construction. Thereby helping to address real-world issues such as housing shortages.

Other advantages include the ability to provide rich CAD or BIM data virtually instantly. This enables easy integration with existing modelling, project management, costing management, pre-construction, plan visualisation, and architectural design software. For example, output information generated by the present technology can be provided to external or third-party software packages, for example by exporting data, providing access through Application Programming Interfaces (APIs), web or cloud-based integration or by delivering multi-functional tailored software to meet industry needs.

Several examples of applications for the present technology include integration with or support for:
- Project review and collaboration software;
- Sales tools for preparing bids, quotes and Requests for Information (RFIs);
- Financial, timeline and compliance planning software;
- Design solution software; and
- Interior and/or exterior 3D visualisation/walk through software for design, review and sale

6.4. Architectural Plan Pre-Processing

Page Identification

Plans for building construction typically span a large number of pages (typically 50-80 pages or more), that are required in order to provide the level of detail required to construct a building. Generally speaking, each of the pages of the plan focusses on different elements or features of the building, such as the buildings foundation, section, elevation, engineering requirements, floor, frame, roofing/truss, electrical, plumbing, landscaping etc.

It can be advantageous, to identify which pages of the plan include which features, in order to ensure that the appropriate object detection, semantic segmentation and text recognition algorithms are used. This information can also be used to provide high-level context about the building plan, for example by providing knowledge to the knowledge representation and linkage module described herein. Additionally, the location of any object on the plan can be used to aid in the classification of the object if there is any ambiguity. For example, lines on a page which provides electrical wiring are more likely to relate to walls or wiring, than to landscaping, plumbing or furniture objects.

This page identification process can be performed in a number of ways, such as:

- Manual identification by a user, for example having a person look at each page and label the page accordingly.
- By extracting text from each page, either manually or by using one or more text recognition algorithms as described herein. For example, some pages may be labelled in a way which indicates what the plan is showing.
- By using an appropriately trained machine learning model, which is configured to perform high-level image recognition on each of the pages of the plan as a whole to classify each page accordingly. For example, any such machine learning model may be trained using any of the techniques described herein.
- By inferring the context of the page, based on the type and number of objects identified on the plan. For example, where furniture symbols and objects are detected on the plan, it can be inferred that the plan is more likely to relate to furnishings, than framing, trusses, or landscaping etc.

It should be appreciated that not all building plans include text explaining what each page is showing, and furthermore, there are inconsistencies between how certain types of page are labelled. For example, a page titled "Roof Framing Plan" may have the same meaning as "Truss Detail Plan" from another architect. Accordingly, there is a need to learn and accommodate new terminology as it is identified. This may be done using the human in the loop processes described herein.

Object Detection and Recognition Algorithms

In examples of the present technology, object detection and recognition algorithms are used to identify objects as defined herein (including symbols) on an architectural plan. The detection algorithms described herein are also configured to recognise (or at least attempt recognition of the object) and identify location information on the plan relating to the identified object. For example, this location information may include coordinates for the object, and/or dimensions for a bounding box for the object.

Object detection and recognition can be performed using any suitable object detection and/or recognition algorithms, or combination or object detection and recognition algorithms known in the art. For example:

- Adaptive thresholding techniques including OSTU, Fukunaga, Normalization, waveletes, or Merging Basins
- Thresholding regions of the architectural plan based on intensity using rule based and goal centric clustering techniques
- Shape analytical techniques including line, circle, curve, rectangle, contours, detection and vectorised diagrams to classify or cluster the structures.
- Mathematical morphology methods including Generalized Morphology, Morphology Correlations or Marker-based Watershed.
- Region Based Convolutional Neural Networks, including RCNN, Fast R-CNN, and Faster R-CNN.
- 'You Only Look Once', YOLO algorithms, including 'You Only Look Once': YOLO, YOLO9000, YOLOv2, or YOLOv3 and onward iterations.
- 'Single Shot Detector', SSD algorithms.

The foregoing list is in no way meant to be exhaustive, and other technologies may be used without departing from the spirit and scope of the technology. Furthermore, it should be appreciated that any combination of object detection and recognition algorithms may be used. Where a combination of object detection and recognition algorithms are used, decisions can be made as to the likelihood of accurate detection by comparing the outputs of the multiple object detection and recognition algorithms for confidence values or agreeance on the feature identified. In some cases, it may be advantageous for certain object detection and recognition algorithms to take precedence for certain types of object. For example, if shape analytical techniques identify an object as a door, this classification may hold higher weight than the result of any other object detection and recognition algorithms.

It should also be appreciated, that in some circumstances, an object identified by the object detection and recognition algorithms described herein may consist of an overlap of two or more architectural symbols, lines or text elements. Particularly where this overlap occurs frequently on architectural plans determining what is depicted by overlapped symbols, lines or text elements is detailed further below.

In the inventor's experience, adaptive thresholding has been found to be useful in detecting foreground architectural objects such as walls, doors and windows from background shading, texturing and patterns. Similarly, shape analytical techniques were found to be effective in detecting architectural symbols such as doors, bathtubs etc.

In an embodiment the present disclosure utilises the following object detection/recognition algorithms:

RCNN can be used to extract region information from the architectural plans, by using selective search techniques. This is useful at reducing the number of locations that need to be considered, and helps to solve the CNN localization problem which should be familiar to those skilled in the art. This technique classifies the objects in the image (recognition) and localizes the region in which the objects are placed.

Fast R-CNN can be used to generate a feature map (one-stage training) as opposed to extracting region information. It does this by processing the entire architectural plan, or pages thereof to create a feature map. From the feature map, region information can be identified and fed into a fully connected layer. A further advantage of using Fast R-CNN is that it allows faster processing than traditional RCNN approaches.

Faster R-CNN uses Region Proposal Networks (RPN) instead of the Selective Search approach. RPN mainly tell the Fast R-CNN where to look. Similar to Fast R-CNN, a single CNN takes an entire image as the input and produces a feature map. On the feature map, RPN generates a set of rectangular object location proposals with object classification/identification confidence scores as output. These values are then reshaped using region of interest pooling to predict classes and offset values for bounding boxes.

YOLO uses a single neural network that predicts bounding boxes and class probabilities directly from entire images in one evaluation. Through a single-stage feed-forward strategy, the model divides the image into grids, each grid cell predicts bounding boxes and confidence scores for these boxes.

SSD speeds up the process by eliminating the need for the region proposal network. To recover the drop in accuracy, SSDs apply a few improvements including multi-scale features and default boxes. These improvements allow SSDs to match the Faster R-CNN's accuracy using lower resolution images, further improving processing speed.

For some architectural objects, rules and algorithms can be put in place to detect specific objects. For example, in the case of a door, various shape analytical techniques can be configured to detect the object by looking for an arc which terminates in a straight line. However, where there are inconsistencies in the representations of these objects, or the objects are overlaid with other information on the architectural plan, it may be advantageous to use alternative detection methods, including those which have been trained using machine learning models.

Advanced image matching techniques such as SIFT (Scale Invariant Feature Transform), SURF (Speeded-Up Robust Features), and CHT (Circle Hough Transform) have been trialled by the inventors however, these techniques require the user to define the important characteristics of each object requiring identification, are not generalisable across a wide variety of plans, and are poor at accommodating variations such as feature or object overlap.

In contrast the present technology employs deep learning algorithms to determine the key characteristics of each of the objects and understand the underlying patterns between related objects. The result is a highly generalised approach to object recognition which is far more accurate at performing object detection. In general, deep learning involves extracting features from objects and images to form a definition of each object class. At the deployment stage, these definitions are searched for in other images.

Deep Learning methods include both two-staged methods and one-staged methods (such as YOLO) as should be familiar to those skilled in the art.

Machine Learning

One example of a machine learning method is to provide a neural network with examples of the symbols the neural network is designed to detect, thus allowing the neural network's model to discover the underlying patterns and automatically determine the most descriptive and salient features to detect. The machine learning model can then learn to identify the symbols using a progressive goal-oriented trial and error training strategy as should be known to those skilled in the art. Other suitable machine learning technologies, including supervised learning, unsupervised learning, semi-supervised learning, transfer learning, transformers, and reinforcement learning may also be used without departing from the spirit or scope of the technology.

Accordingly, one output of the object detection and recognition algorithms described herein is the ability to identify and locate objects on an architectural plan. In further examples described herein, this location and identification process serves as a pre-processing step to enable further and more complex analysis of the architectural plan.

Use of object detection and recognition algorithms is believed to be novel in the construction industry, the analysis of real-world (including compliant) plans for building construction as described herein, and the process of providing estimations. Use of the technology in these industries could be highly beneficial in reducing the time required to analyse, validate, or compare differences between architectural plans, as well as reducing the cost and time involved in preparing estimations as described herein.

Accordingly, the present technology provides systems for identifying objects on an architectural plan using one or more processors configured to execute one or more object detection and recognition algorithms, wherein the algorithms are trained using machine learning.

Semantic Segmentation Algorithms

Referring to FIG. 1A it can be seen that architectural plans 100 often include large amounts of overlapping detail. This includes text, dimensions, structural elements, symbols etcetera. These overlapping details are able to be deciphered and the context inferred by highly skilled architects and quantity surveyors.

Accordingly, the present technology uses one or more semantic segmentation algorithms to output segmented regions of the architectural plan, irrespective of what objects are contained within those regions.

For example, the semantic segmentation algorithms may segment an area of an architectural plan which corresponds to a first room, and an area of an architectural plan which corresponds to a second room, without further processing differences in the rooms, or attempting to infer the context or use of the room. In another example, a segment may include a plurality of objects or one or more parts of an object, or an area containing no objects such as an empty room.

In some examples, the semantic segmentation algorithms may be able to distinguish segmented areas from one another such as stairwells from bedrooms. However, the primary purpose of the semantic segmentation algorithms is to identify and locate relevant areas on the architectural plan.

One aspect of the present technology is to use semantic segmentation algorithms to detect and segment these objects on the architectural plan. However, identifying and segmenting these complex intertwined details however is difficult for traditional machine vision technologies.

The types of overlapping details seen in architectural plans have been effectively used to prevent computer systems from posing as human's on the internet. See for example the "Completely Automated Public Turing test to tell Computers and Humans Apart" aka CAPTCHA technologies.

These CAPTCHA systems are used to deliberately obscure alphanumeric characters. The task of deciphering the CAPTCHA image often requires looking for deliberately hidden and often distorted alphanumeric characters and discarding anything that is unrelated. In contrast the segmentation algorithms used on architectural plans have the difficult yet, not impossible task of being able to distinguish and decipher overlapping lines, curves, shading, alphanumeric characters and hand-written text.

Accordingly, the segmentation algorithms of the present disclosure, when applied to architectural plans, need to be able to determine the start and end points of lines, text, and symbols, and identify features such as rooms. Often in situations where these lines, text, rooms and symbols overlap.

In some cases, this process could be referred to as object detection/recognition and segmentation in one end-to-end architecture. For example, the process may involve the identification of the objects and define the object's boundaries so that the algorithms can provide the aforementioned location information such as start and end points.

In examples of the technology, the sematic segmentation algorithms comprise one or more of:
- 'You Only Look at Coefficients': YOLACT or YOLACT++.
- Convolutional Neural Networks (CNN) configured to perform pixel-by-pixel classification of each pixel in the image. Including CNNs such as U-Net which are configured to encode and decode a set of learnable visual features to provide pixel-wise classification for each and every region.
- Fully Convolutional Networks (FCN) trained end-to-end and pixel-to-pixel for the task of image segmentation.
- Mask R-CNN: The Mask R-CNN framework is built on top of Faster R-CNN. So, for a given image, Mask R-CNN, in addition to the class label and bounding box coordinates for each object, will also return the object mask.

Other suitable semantic segmentation techniques may be used as should be understood by those skilled in the art. It should also be appreciated that a combination of semantic segmentation algorithms may be used in the present technology. For example, YOLO may be preferred for assigning grids to the architectural plans, while YOLOv3 is used for detection of small objects on the architectural plan.

The resulting output of the semantic segmentation algorithms are sets or clusters of pixels which represent, objects or areas on the architectural plan. These outputs may also include labelling information as to what the sets are likely to represent and numeric weightings as to the algorithms confidence that it has correctly identified the object (i.e. door, room, wall etc).

These identified segments are passed to the one-shot learning module as objects for vectorisation and classification. By focusing on segments identified by the semantic segmentation algorithms described herein, the present technology can be efficiently and effectively identify relevant features and objects on the plan.

Machine Learning

In an example, the Semantic Segmentation Algorithms are trained using supervised machine learning methods.

One example of a machine learning method is to provide a neural network with examples of the types of segmentation the neural network is designed to detect, thus allowing the neural network's model to discover the underlying patterns and automatically determine the most descriptive and salient features to detect. The machine learning model can then learn to identify the segments using a progressive goal-oriented trial and error training strategy, as should be known to those skilled in the art. Other suitable machine learning technologies may also be used without departing from the spirit or scope of the technology.

The algorithm is configured to segment the differentiable areas on the architectural plan regardless of what the segment represents. This is preferably done using instance-segmentation techniques.

Accordingly, one output of the semantic segmentation algorithms described herein is the ability to identify and locate segments on an architectural plan. In further examples described herein, this location and identification process serves as a pre-processing step to enable further and more complex analysis of the architectural plan.

Use of semantic segmentation algorithms is believed to be novel in the construction industry, the analysis of real-world plans (including compliant plans) for building construction as described herein, and the process of providing estimations. Use of the technology in these industries could be highly beneficial in significantly reducing the time required to analyse, validate, or compare differences between architectural plans, as well as reducing the cost and time involved in preparing estimations as described herein.

Accordingly, the present technology provides systems and methods of segmenting areas or objects on an architectural plan, using one or more processors configured to execute one or more semantic segmentation algorithms configured to detect segment areas or objects on the architectural plan, whereby the algorithms are trained using machine learning.

Text Recognition Algorithms

Architectural plans commonly include printed and handwritten text including alphanumeric characters and symbols. Text can thus be used for descriptions, dimensions, engineering and construction specifications, materials, standards and object labels.

The relative positioning of text to other objects on the architectural plan may often be just as important as the text itself.

Accordingly, the present technology employs text recognition algorithms to recognise the text (in addition to identification of text strings via the semantic segmentation algorithms), read and understand the text, and identify the relative positioning of the text on the plan. This is done by reading each and every letter or number of the text, in order to infer the composition and understand the context of the text.

To account for shorthand notes, and architectural specific terms and context, an architecture specific language corpus is used and maintained or trained with new terms, abbreviation and shorthand text being added as they are identified.

To process the text, the text recognition algorithms employ one or more of the following:
- Recurrent neural networks (RNN) to process variable length sequences of text.
- Long short-term memory (LSTM) to process sequences of images or text.
- Natural language processing algorithms such as Word2Vec.

The aforementioned examples should not be seen as limiting on the technology, and other text recognition algorithms may be used without departing from the spirit and scope of the technology.

Machine Learning

It should be appreciated that the text on an architectural plan is often in shorthand or includes industry specific acronyms. Accordingly, the text recognition algorithms described herein, are preferably trained or taught to recognise and infer the meaning and context of the shorthand/algorithms to provide a meaningful output.

One method of achieving this is to train the text recognition algorithms using machine learning methods as should be known to those skilled in the art.

One example of a machine learning method is to provide a neural network with examples of the text, words, letters and numbers the neural network is designed to detect, thus allowing the neural network's model to discover the underlying patterns and automatically determine the most descriptive and salient features. The machine learning model can then learn to identify the text using a progressive goal-oriented trial and error training strategy as should be known to those skilled in the art. Other suitable machine learning technologies may also be used without departing from the spirit or scope of the technology.

One output of the text recognition algorithms described herein is the ability to identify and locate text on an architectural plan. In further examples described herein, this location and identification process serves as a pre-processing step to enable further and more complex analysis of the architectural plan.

Use of text recognition algorithms is believed to be novel in the construction industry, the analysis of real-world plans for construction as described herein, and the process of providing estimations. Use of the technology in these industries could be highly beneficial in reducing the time required to analyse, validate, or compare differences between plans, as well as reducing the cost and time involved in preparing estimations as described herein.

Accordingly, the present technology provides systems and methods of recognising and interpreting text on an architectural plan, using one or more processors configured to execute one or more text recognition algorithms configured to detect and interpret text on the architectural plan, including the relative position of the text on the plan whereby the algorithms are trained using machine learning.

6.5. Training Methodologies

To train an AI system using machine learning, there is a need to provide large datasets. Unfortunately, there are no suitable, publicly available data sets of real-world plans for building construction available, and given the costs and expertise involved in the production of these plans, it would be uneconomical to prepare plans for the purposes of training.

Where data sets are publicly available, these data sets are often overly simplified and do not represent real-world architectural plans, and as such use of these data sets in training models results in systems which in practice can only be used to extract data from similarly simplified plans.

See for example FIG. 2 which shows a representative example of the types of architectural plans which are publicly available for use. These plans are highly simplified, have minimal information overlap, very little handwritten text, use of shorthand or acronyms.

In addition, even if access was available to many real-world plans for building construction. There would need to be careful consideration of whether the plans could be used, and who owns the copyright in the plans.

Consideration also needs to be given to the country and climate of origin of any architectural plan used for training purposes. As training any AI system exclusively on architectural plans designed to meet certain building regulations, climate conditions, or local material supply can result in an AI system which is unable to adapt to changes in building processes, materials, or regulations.

On aspect of the present technology is to provide a model trained on a dataset of at least 10,000 plans for building construction which have the same levels of detail and/or complexity as real-world (including compliant) architectural plans. Ideally this model would be trained using at least 30,000 plans. However, the exact numbers should not be seen as limiting on the technology, and it should be understood, that the more plans used, the better the model is likely to be at identifying related objects on an architectural plan.

Methods of training an AI model based on large datasets are known, but in broad terms if the dataset comprises labelled information, supervised or semi-supervised machine learning methods may be used to train neural networks to study the labelled features in the dataset. Where the dataset contains unlabelled information unsupervised learning methods can be used so that the neural network can infer what characteristics to learn from. The trained neural networks are then able to determine the most relevant features for a given task based on the weightings within the network.

One method of generating this training data is to use a Generative Adversarial Network (GAN) as is described herein. However, this should not be seen as limiting on the technology, and in other examples the model may be trained over time as architectural plans become available.

Irrespective of whether the models described herein are trained using GANs, the confidence and accuracy of detecting types of objects on an architectural plan is expected to increase as the number of related examples in the feature vector space increases. For example, traditional hinged doors may be particularly common and consistent in the way they are represented on architectural plans, and therefore the models described herein may be able to accurately detect these objects with a high-level of confidence faster than other objects (such as cavity sliding doors).

Accordingly, the present technology allows for the use of different confidence thresholds between objects on the architectural plan. For example, a high threshold of approximately 90% may be applied to hinged doors, meaning that any hinged door automatically detected with a confidence of at least 90% is considered to be an accurate detection and is added to the high-level feature vector space, while any hinged door detected with a confidence of less than 90% may be sent to a human for review as described herein.

In examples where the feature vector space has relatively few examples, and the related confidence of classification is likely to be lower (such as a cavity door), the present technology may employ a lower threshold, such as 60%. These thresholds are adaptable, can be learned (for example based on the percentage of classifications which are unchanged by a human reviewer) and adjusted over time to ensure that the resulting output information is accurate, and can be prepared quickly.

Where the feature vector space includes relatively few examples of a feature (such as sliding cavity doors) it may be advantageous to use a GAN to synthesise a large number of these objects, or otherwise produce an architectural plan comprising a large number of these objects with slight variations in order to improve the model. For example, variations such as line dimensions, shading, proximity to other features, overlap etc may be introduced in order to expand the feature vector space. These variations may be generated by constraining particular aspects of the generators described herein, manually adjusted, or by taking feature variations from other objects on the plan, such as overlap present on a hinged door, and applying it to a cavity door object.

Generative Adversarial Networks (Gans)

One approach to generating the required training data is to use a generative adversarial network (GAN) to generate highly sophisticated architectural plans which one or more of the object detection and recognition, semantic segmentation, and text recognition algorithms can be trained on.

GANs include two modules, namely a generator and a discriminator. The generator is configured to synthesise artificial architectural plans (often referred to as faux/fake data) and the discriminator is configured to distinguish the artificial architectural plans from real architectural plans (often referred to as real data).

Accordingly, through the interplay of the generator and discriminator, the generator learns to synthesise better data, and the discriminator learns very detailed specifics about the differences between the synthesised architectural plans and the real architectural plans. This feedback loop continues until an equilibrium point is reached (normally the end of the training) whereby the generator is able to synthesise almost realistic data, and the discriminator always fails to tell the synthesised data from the real data.

The inventor is not aware of any previous use of GAN technology in the field of providing architectural plan estimates. For example, there is no existing technology which can generate training data which is sufficiently representative of real-world plans for building construction, let alone sufficiently detailed to allow for accurate object recognition, measurement, or feature extraction.

Use of GANs is believed to be novel in the construction industry, the analysis of architectural plans as described herein, and the process of providing estimations. Use of the technology in these industries could be highly beneficial in providing meaningful training data, reducing the problems with oversimplified data sets.

Accordingly, the present technology provides systems and methods of generating architectural plans using at least one processor configured to run at least one generative adversarial network, wherein the generative adversarial network is configured to generate architectural plans or subcomponents of architectural plans.

Examples of Generative Adversarial Networks

In one example of the technology, an Auxiliary Classifier GAN (ACGAN) is used. The ACGAN may be used to synthesise parts of an architectural plan, or whole architectural plans at a time.

Figure 4:
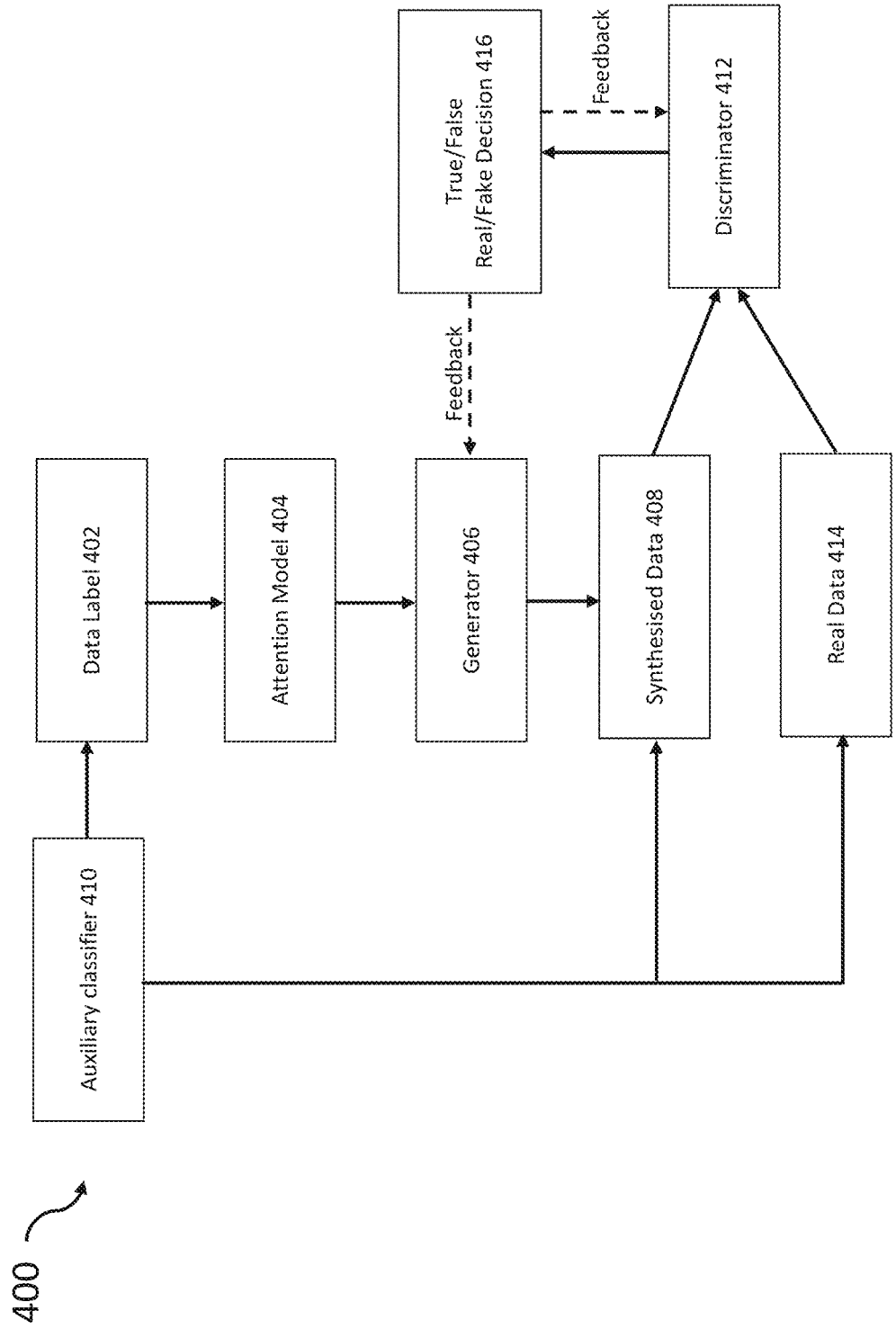
FIG. 4 shows an example of a ACGAN in accordance with some embodiments.

FIG. 4 shows one example of an ACGAN 400 in accordance with the present technology. As shown, one departure from the conventional ACGAN model is the introduction of an attention model 404 which enables focusing the ACGAN on generating specific parts of the architectural plan, or objects on the architectural plan, rather than synthesising complete architectural plans at once. This allows for targeted improvement of specific object generation, as well as overall architectural plan synthesis.

The ACGAN model works by providing a label 402 or classifier which provides instructions as to what the generator should synthesise. The attention model 404 can then further focus the scope of the generation task to a specific element such as the generation of a door or window for example.

The generator 406 then uses its learned representations of the task to synthesise an artificial version of the object, otherwise known as fake data 408. This fake data 408 is also classified by the classifier 410, and provided to the discriminator 412 so that the discriminator 412 knows the type of object it is looking at, and can compare features about this object based on what it has learned about these objects.

The discriminator 412 is then tasked with comparing the fake architectural plan data 408 against real architectural plan data 414 and is tasked with determining which piece of data is real, and which is fake. This true/false, or real/fake decision 416 is then fed-back to the generator and discriminator using back-propagation to further refine the generation and discrimination algorithms.

Ultimately, once the ACGAN has been trained, the discriminator 412 is unable to detect fake data from real data, and the resulting synthesised/fake data 408 is virtually indistinguishable from the real data 414. This synthesised, or fake data 408 can then be used to train the algorithms described herein such as the object detection and recognition algorithms, semantic segmentation algorithms, text recognition algorithms and one-shot detection algorithms. In another example of the technology a DCGAN or DiscoGAN may be used to transfer specific objects or features from one architectural plan to another. In this way variations to architectural plans can be made quickly and efficiently.

In another example of the technology, a conditional GAN or cGAN is used to polish the data sets. In particular a cGAN may be used to increase the quality and/or resolution of architectural plans or create classes of data where architectural plans require more accuracy.

In another example of the technology, a StackGAN may be used to cross-check image detection and measurement with text in the engineering plan.

In another example of the technology, an InfoGAN may be used to provide better unsupervised learning, particularly given the intertwined nature of the architectural plan data sets. An InfoGAN can be used to discover its own correlations in the data.

In another example, Wasserstein GANs may be used to ensure stability during the network learning stages. Thereby reducing the need to balance the respective generators and discriminators.

In another example, CycleGANs are used to perform neural transfers to improve the artifacts and features of an architectural plan.

In examples of the technology, where more than one GAN is used, the system may include a GAN aggregator 500 as shown in FIG. 5A. The GAN aggregator 500 comprises any number of GAN modules 1-X, each of which may be configured to generate specific parts of the architectural plan.

In some scenarios, multiple GAN modules are configured to generate the same features using different techniques, to get improved confidence of the generation accuracy.

The GAN aggregator is configured to determine which GAN is best suited to the task at hand. In some examples of the technology, the GAN selection module may be pre-configured, for example, where a low confidence of text interpretation is identified, the GAN selection module may be configured to use a StackGAN to synthesise an image from the text, and the resulting image analysed by one or more GANs to determine whether it makes sense in the context of the plan.

In other examples, of the technology, the GAN aggregator may be self-adapting. In other words, the GAN selection module may select the correct GAN method to apply based on any one of a range of factors which can change over time. One example, would be comparing the architectural plan to previous architectural plans, and where high amounts of similarity are found, the GAN selection module may consider the results of previous GAN outputs on the similar plan, and whether those outputs improved the quality of the architectural plan in a meaningful way. If not, the GAN selection module may choose to not repeat the GAN process, or select a different GAN process.

Once the GAN network has synthesised the requested features, these features can be provided to an object analysis and collation module configured to collate the information and synthesise a complete architectural plan. For example, the doors on the architectural plan may be generated using a GAN dedicated to the task of generating doors.

In other examples, the GAN aggregator may be configured to take the specific objects and provide these objects to any of the supervised machine learning algorithms described herein, without collating these objects into a complete architectural plan. For example, synthesised door models may be provided to train an object detection and recognition algorithm, or doors with dimensional data may be provided to train the object detection/recognition and text recognition algorithms described herein.

Accordingly, the present technology provides systems and methods of selecting between generative adversarial networks to optimise the generation of architectural plans using at least one GAN selection module.

Architectural Plan Generation Using GANs

Another application for Generative Adversarial Networks (GANs) is in the validation and improvement of architectural plans. Once the GAN model(s) have been sufficiently trained, it is possible to have the GANs process an architectural plan to determine whether the features, and objects on the plan match the expected trained features. A diagram illustrating this is shown in FIG. 5B.

As shown the Architectural plan validation system 550 takes an architectural plan 552 as an input. This architectural plan 552 may be real or synthetic (generated by one or more GANs as described herein).

The architectural plan 552 is then processed by one or more trained GAN discriminators 554A, 554X to determine whether the features on the architectural plan are "real" that is to say match an expected range, type or quality of feature.

If the features are determined to be 'real' they can then be passed to the pre-processing algorithms as described herein, such as object detection and recognition algorithms, semantic segmentation algorithms and/or text recognition algorithms.

If the features are determined to be 'fake' or do not match an expected range, type or quality, then a trained generator can be used to synthesise a replacement feature. For example, the present technology may find particular application in the enhancement of a low quality or low-resolution architectural plan or validating that an architectural plan matches a set of input parameters which were used to generate the architectural plan.

Other examples of features which may appear as 'fake' include objects which have significant overlap with other features on the plan. According the technology can be used to "clean" the architectural plan 552 by synthesising replacement or high-quality representations of the features.

In the example shown, the output of the generator(s) are provided directly to the pre-processing algorithms, this is because the generator is configured to correct or otherwise provide the missing features which caused the discriminator to mark the feature as "fake". This however should not be seen as limiting on the technology, and in other examples, the subsequent generation stages may be subject to further discrimination.

It should be appreciated that the generators described herein do not statistically influence or override any discriminator which it is not related to. This is known as the Hilbert space concept, where many GANs can co-exist. Accordingly, the present technology allows for features to be transferred from GAN to another without affecting higher concepts. For instance, a door, window, or wall etc. may be substituted without affecting the other components of the architectural plan, or the operation of a GAN unrelated to the door, window, or wall etc.

Where the present technology is used for the generation of synthetic plans, the GAN can be configured with one or more constraints, while allowing variation of other aspects. For example, the material or structure of a door can be constrained as required, and the GAN can be configured to with the freedom to create variations in size or location. This is done by constraining the loss function of the GAN such that the discriminator punishes certain feature variations more highly than others, resulting in a higher loss for undesirable changes.

For example, a GAN could be configured to reposition a door on an architectural plan, while having constraints on how the dimensions, materials or specification may be changed.

6.6. One Shot Learning/Hierarchical Machine Learning

Each object identified by the object detection and recognition algorithms, and each segmented area identified by the semantic segmentation algorithms are converted into feature low-level vector space (representations) through a feature vector space model or hierarchical machine learning model or machine learning based similarity detection algorithm. For sake of simplicity, throughout the present specification this is referred to as a one-shot learning module or process, however the use of one-shot learning should not be seen as limiting on the technology, and other similarity detection algorithms may be used including zero-shot, few-shot, and low-shot learning.

Feature vector space is a concept which should be familiar to those skilled in the art and is defined herein. But in broad terms, it describes an N-dimensional feature space wherein related concepts/objects are positioned close to other similar concepts or objects within the vector space. Accordingly, when new objects are identified, they can be converted to the feature vector space representations and their proximity compared to other objects/concepts within the feature vector space to determine the likelihood of being a certain feature.

The process of conversion to a vector space representations is a multi-stage process which is capable of weighting the low-level features (doors, windows, and parts thereof etc.) differently when it comes to forming the high level space/feature (rooms, bathrooms, etc.). These weights or "occurrences" are to be learnt through a machine learning process such as an ensemble voting technique.

For example, a kitchen shown on an architectural plan may be represented as a sink symbol, stove symbol, oven symbol, window symbol, together with the location and adjacency to other rooms and features on the plan. Each of the detected symbols has a confidence score for detection. The described set of features will be the input for a high-level kitchen object or room on the architectural plan. Which in turn, a high-level feature vector will be created through the explained one-shot learning process.

The likelihood associated to each symbol/feature, will be inferred through an iterative learning process. For example, if 90% of the previously identified kitchens had a stove, the likelihood of the stove being present in the kitchen class would increase. Similarly, the rare presence of an armchair in the kitchen, would impact the associated likelihood but the one corresponding to the living area. The same strategy is to be utilized to correct any misidentification.

For example, the similarity detection algorithms may include the use of the "You Only Look Once" (YOLO) similarity detection algorithms, including but not limited to YOLO9000, YOLOv2 and YOLOv3, "You Only Look at Coefficients" (YOLACT or YOLACT++), and Fast Region-based Convolutional Networks (Fast R-CNN). The aforementioned algorithms should be known to those skilled in the art, but for completeness the following references are herein incorporated by reference in their entirety:

Joseph R, Santosh D, Ross G, Ali F 9 May 2016, 'You Only Look Once: Unified, Real-Time Object Detection' University of Washington Allen Institute for AI, Facebook AI research, arXiv:1506.02640v5 available at https://arxiv.org/pdf/1506.02640v5.pdf Joseph R, Ali F, 25 Dec. 2016, 'YOLO9000: Better, Faster, Stronger' University of Washington Allen Institute for AI, arXiv:1612.08242v1 available at https://arxiv.org/pdf/1612.08242v1.pdf Joseph R, Ali, F, 8 Apr. 2018, 'YOLOv3: An incremental Improvement' arXiv:1804.02767 available at https://pjreddie.com/media/files/papers/YOLOv3.pdf Ross G, 30 Apr. 2015, "Fast R-CNN" arXiv:1504.08083 available at https://arxiv.org/abs/1504.08083.

Daniel B, Chong Z, Fanyi X, Yong J, 4 Apr. 2019. "YOLACT: Real-time Instance Segmentation" arXiv: 1904.02689 available at https://arxiv.org/abs/1904.02689

Daniel B, Chong Z, Fanyi X, Yong J, 3 Dec. 2019. "YOLACT++: Better Real-time Instance Segmentation" arXiv: 1912.06218 available at https://arxiv.org/abs/1912.06218

The resulting feature low-level vector space representation is a generalisable representation of the objects. For example, a part-based model, such as a constellation model may be used.

In broad terms, the similarity detection algorithm is configured to take two images as inputs and differentiate between the similar and different parts of each image. For example, FIG. 6 shows one method of using one-shot learning to compare architectural objects such as symbols, segments, and text against all other representations in the learned feature vector space. Other examples include zero-shot, few-shot and low-shot learning as should be familiar to those skilled in the art.

This comparison of low-level object features ("characteristic features" such as line width, shape, dimensions, patterns, etc.) is compared against other low-level object features within the learned feature vector space. The importance of each of the low-level features being determined or learned by the machine learning algorithms described herein. Based on the similarities of these low-level object features with other learned object features, the one-shot learning algorithm attempts to determine the likely classification of the object. This classified object is then added to a high-level feature vector space, which focuses on the objects as a whole, rather than each of the low-level characteristic features.

Accordingly, even if an object has not been seen before in the high-level feature vector space, it may be able to be classified due to the characteristic features of the object in the corresponding low-level feature vector space, and vice-versa.

If the object is sufficiently adjacent to other objects in either feature vector space, the one-shot learning module can classify the object accordingly. This classification is a form of fuzzy matching which finds find the closest matches in the feature vector space. In this way the similarity detection algorithm can take a symbol or segmented area provided by the object detection and recognition or semantic segmentation algorithm, and compare this image against any previously observed symbol or segmented area in order to determine the likelihood that the image relates to a previously seen or understood image.

These similarity detection algorithms are trained on the architectural plan as a whole which enables learning of the context of the symbol, segment or text within the context of the architectural plan. The resulting representations are a set of unique symbol, segment, or text vectors which form the high-level representation that can be mapped to a Hilbert vector space covering all of the possible variations, including unseen symbols, segments and text within the context.

Once the closest match has been determined, the resulting information is aggregated, and related information can be identified and correlated. For example, the location of text labels next to objects such as doors.

This allows the aggregated representations to be analysed for neighbouring correlations as shown in FIG. 6.

For example, a symbol may have a different meaning when used in proximity to an object such as a wall, door, or window. This information is added to the vector space together with the vectorised information for each object. Over time, the vector space is therefore improved with correlated object information (such as what text next to a door likely means), as well as object information such as how doors, windows and walls are represented by different architects.

Figure 6A:
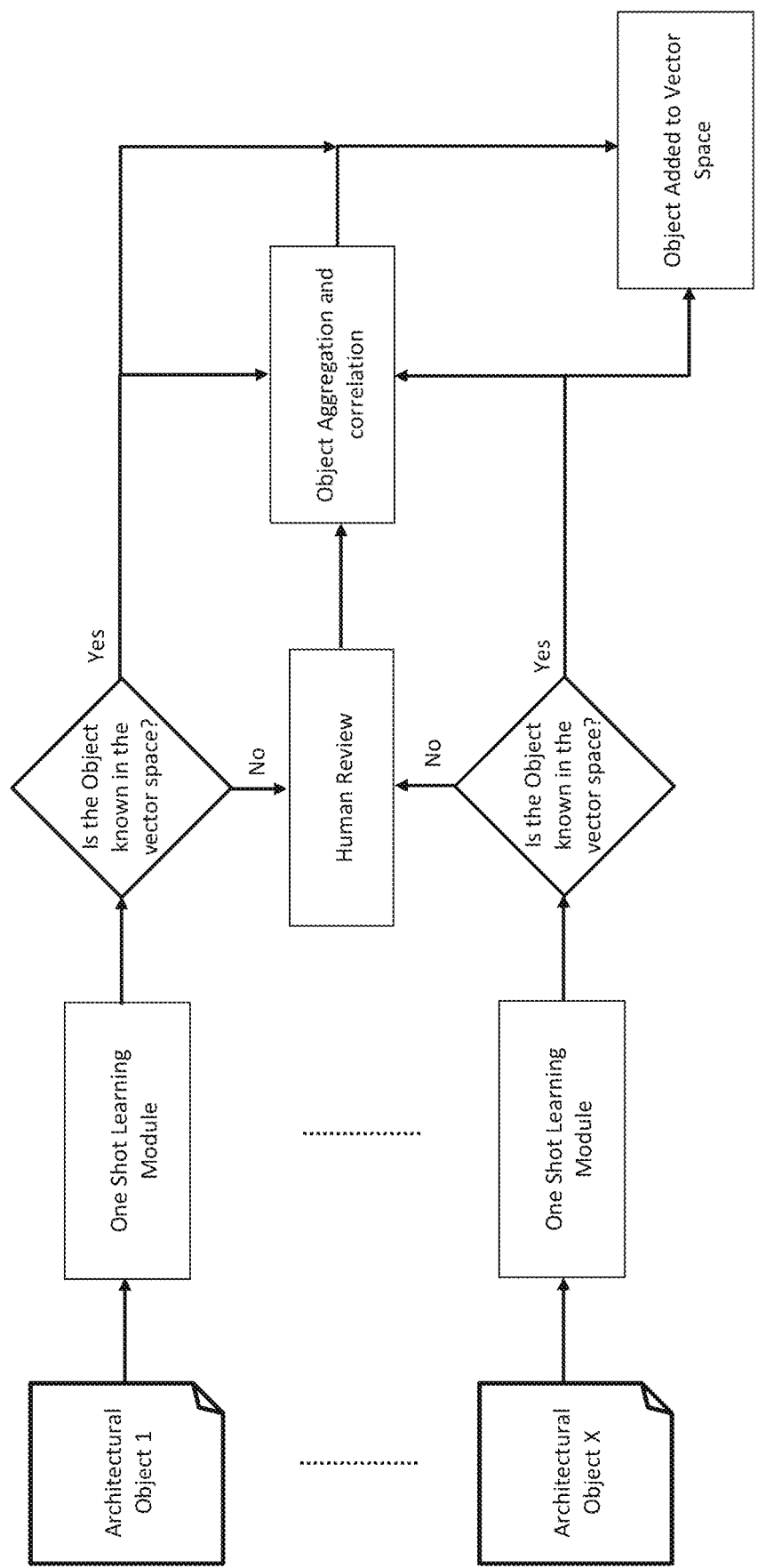
FIG. 6A shows a high-level flow diagram of the one-shot learning module in accordance with some embodiments.
Figure 6B:
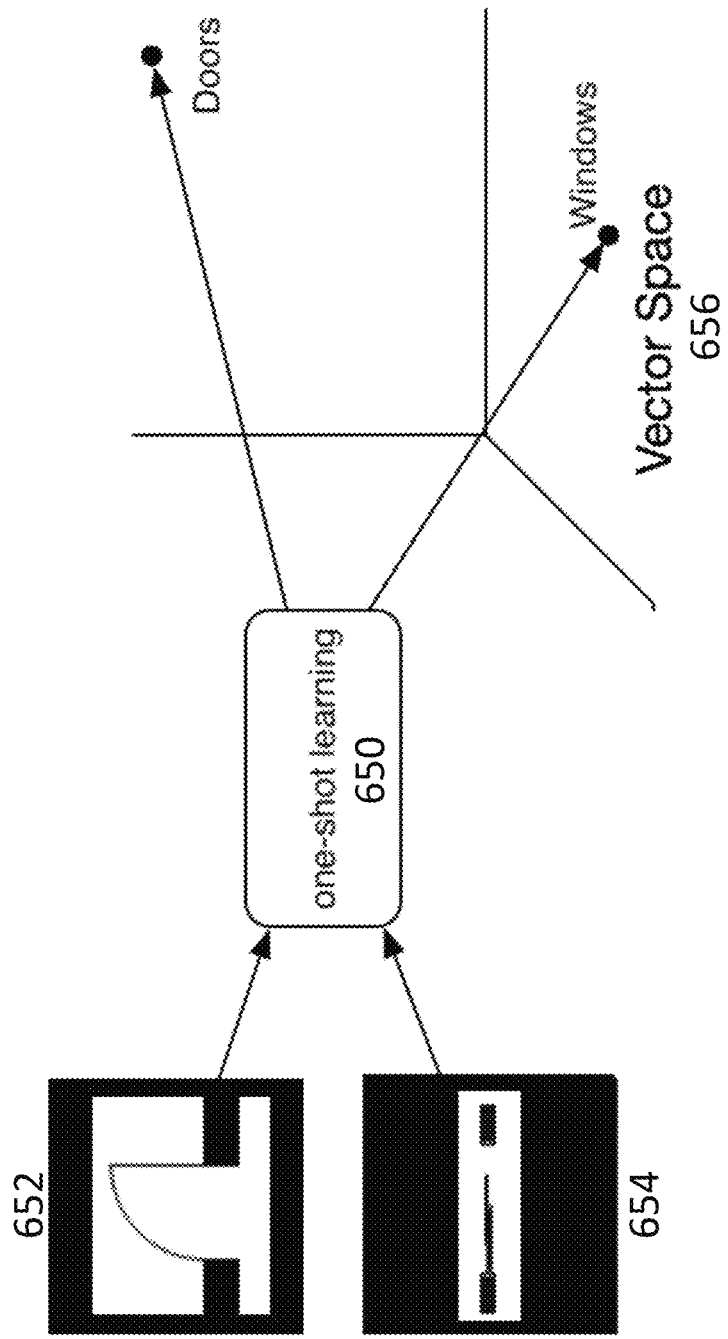
FIG. 6B shows a simplified representation of a one-shot learning module vectorising objects according to some embodiments.
Figure 6C:
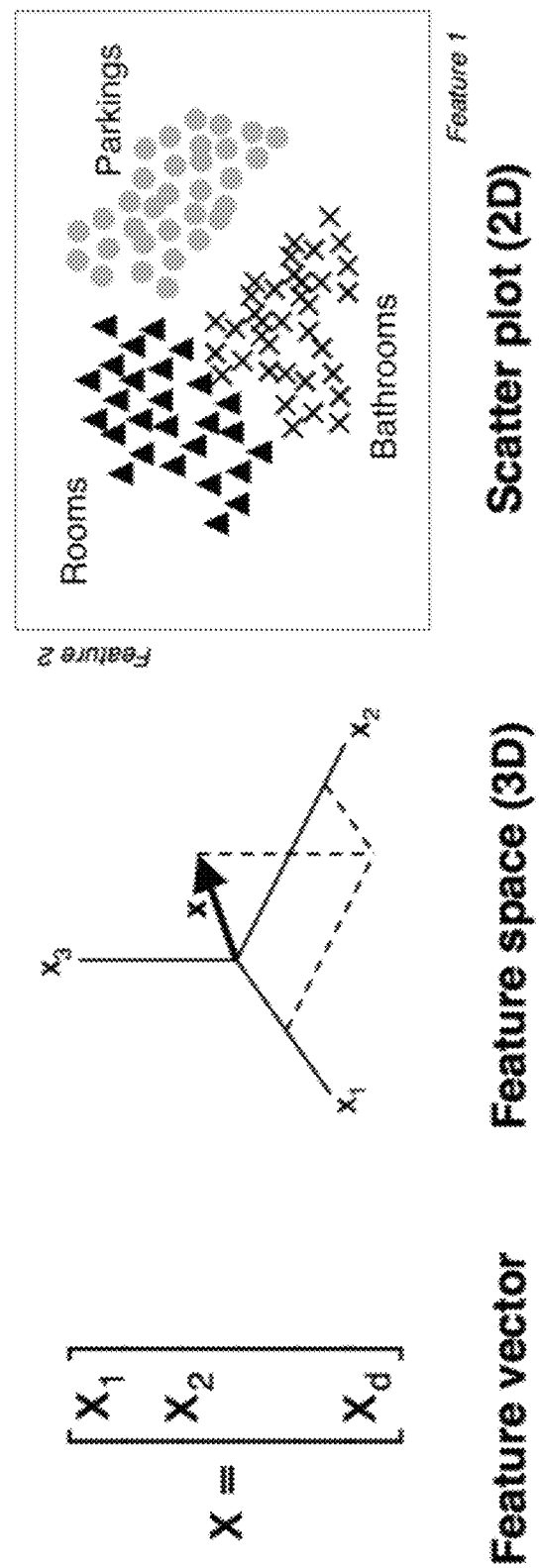
FIG. 6C shows simplified representations of the feature vector space in accordance with some embodiments.

One exemplary visualisation of a feature vector space is shown in FIGS. 6B and 6C. For sake of clarity and explanation, the illustrated vector space is shown as a three-dimensional vector space. However, the vector space is an N-dimensional space as should be understood by those skilled in the art.

As shown the one-shot learning module 650 receives objects 652, 654 as inputs. These inputs a converted to vectors (representative numerical values defining the objects), through a process called vectorisation, which should be familiar to those skilled in the art. The resulting object vectors are placed into a vector space 656 based on their respective numerical values. As additional object vectors are added to the vector space, clusters are formed around certain types of objects (with similar or the same numerical values), or collections of objects such as in a room as shown in FIG. 6C.

As new objects are introduced it is possible to mathematically determine the likelihood or confidence of classification of the object based on its proximity to the other object vectors and clusters of object vectors within the n-dimensional vector space. For example, a new, previously unseen object which is vectorised and falls within a cluster of door vectors is likely to be a door, despite having not previously been seen.

The vectorisation process which is performed on the objects is repeated on the identified features (such as doors, windows etc.) to provide a high-level vector space of concepts such as rooms, bathrooms, garages, kitchens etc.

Where objects have no closely corresponding features in the vector space, these objects may be passed to a human for review as will be discussed in greater detail below.

The classification of an object, segment, or text by the similarity detection algorithm can also be compared with any classification probability determined by the object detection and recognition algorithms, semantic segmentation algorithms or text recognition algorithms in order to determine the likelihood that it has been correctly classified.

The similarity detection algorithms therefore creates a low-level granular feature vector space containing representations of the architectural symbols, areas, text, image features, image characteristics etc. which are grouped to form a high-level database of feature vectors uniquely representing the architectural metadata such as the materials, measurements, counts, quantities, etc.

Each time the similarity detection algorithms receives a new input, it is compared against the low-level feature vector space to find the closest matches. For example, the similarity detection algorithm can be configured to find the top 5 closest matches.

If the confidence of the matches is below a predetermined threshold, or if the top matches have similar confidence of representing different symbols, segments or text, the resulting matches are passed to a human for review as will be described in greater detail below. In this way, the system can be configured to accommodate new, unseen symbols segments and text dynamically.

One of the key advantages of one-shot learning is the ability to detect, identify and learn new, previously unseen objects. For example, one-shot learning is able to identify and classify new unseen objects in situations where the feature vector space has no or very few examples of corresponding objects. This is in contrast to traditional machine learning approaches where an extensive set of examples are required in order to perform accurate detection. Accordingly, the present technology is able to detect new objects quickly and learn (i.e. add the feature vectors to the feature vector space) so that future objects presented in a similar manner are able to be detected with an increased level of confidence.

Measurement

Once the objects, segments and text have been identified and converted to feature vector space representations, various measurement algorithms can be used to determine the dimensions, and therefore quantities and measurements of each object on the architectural plan.

This is achieved by determining the scale of the plan, typically by detecting a scale key, or text representing the plan scale. Alternatively, the scale may be determined by measuring the length of an object which has an associated dimension. The length of the object as shown in the dimension can then be divided by the number of pixels in the object in a corresponding direction to obtain a distance per pixel calculation (or alternatively pixels per distance such as 25 pixel per metre). It may be advantageous for the present technology to measure larger objects on the architectural plan to determine the scale as this approach may minimise the percentage errors resulting from pixelation or digitisation of the architectural plan. Alternatively, the present technology may determine the scale by measuring the pixel dimensions of a plurality of objects calculating distance per pixel or pixel per distance scalars, and averaging the results of same to minimise result variance due to pixelation or digitisation.

Once the scale has been determined, the measurement algorithms can do pixel-by-pixel counting of each segment or object detected to determine the number of pixels (or length) in a given direction. These pixel counts can be multiplied by the distance per pixel scalar, or otherwise compared against the pixel per distance scalar to determine the dimensions of the object. Alternatively, or additionally, the present technology may compare the calculated distance with the dimensional text on the plan, or otherwise rely solely on the dimensional text to determine distance.

Where the dimensional text and calculated dimensions differ by a pre-determined threshold, such as by 10% or more, the present technology may pass the object and associated dimensions to a human for review, and if necessary amendment to update the associated feature vector space.

In the foregoing example, the technology performs pixel counting of objects on the architectural plan, however this should not be seen as limiting on the technology. Pixels are simply a unit of measurement based on the resolution of the plan image. Accordingly, alternative methods of determining dimensions, such as comparing distance on the plan (for example in mm) against real-world distances can be performed without departing from the spirit and scope of the technology.

Use of the object detection/recognition and semantic segmentation algorithms allows the measurement algorithms to accurately determine the dimensions of each object, even where that object overlaps with another object on the architectural plan. In addition, the algorithms used operate in a convolutional manner, gradually decreasing in size which allows for fine-grained segmentation between overlapping objects without splitting the image into arbitrary grid sizes.

The segmentation and measurement algorithms are broken into two smaller tasks that run in parallel: generating a dictionary of prototype masks and predicting a set of linear combination coefficients per instance. The inventors have shown that despite the architectural plans comprising thousands of measurements, the algorithms are able to accurately measure the dimensions of objects within 1 second to 1 minute on a large architectural plan.

One Shot Learning Training

Figure 6D:
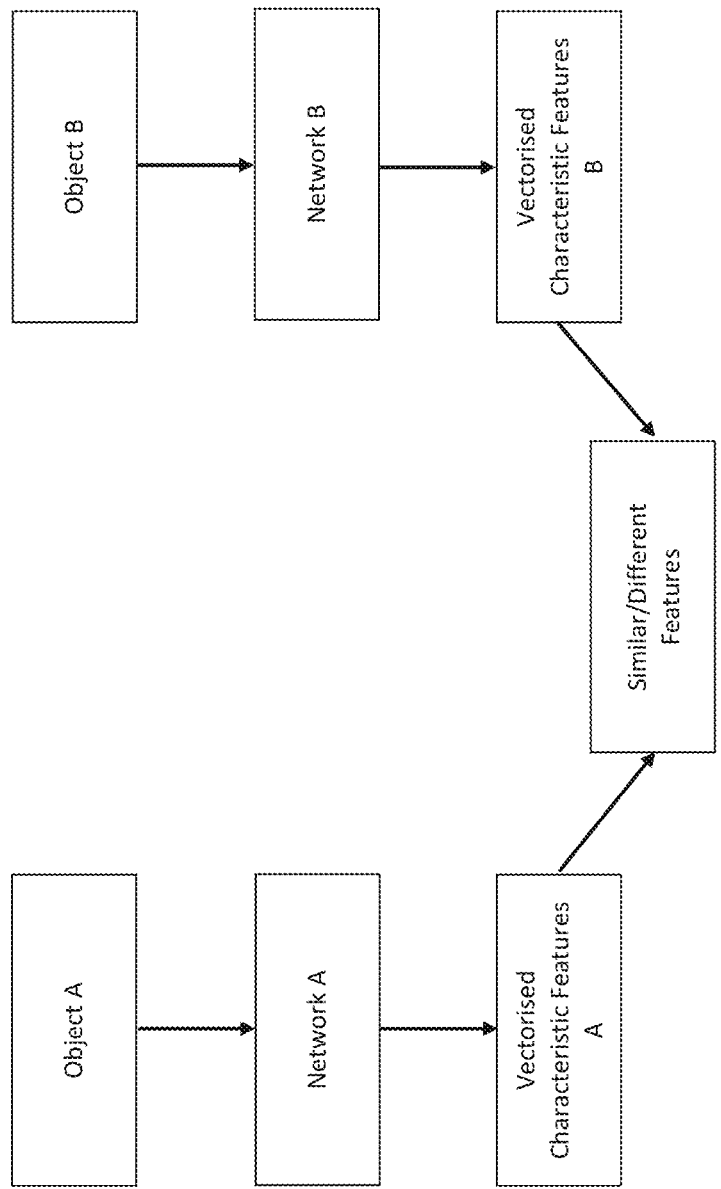
FIG. 6D shows a high-level flow diagram of a workflow for training a model based on one-shot learning in accordance with some embodiments.

A general workflow for training a model based on one-shot learning is shown in FIG. 6D.

As shown, objects which have been detected through the pre-processing modules described herein are fed into two similar and parallel networks, network A and network B. The models are configured to generate a feature vector (representation) for each object and will learn if the two objects are similar or different.

Through the learning process, the characteristic features of the objects are identified, and the feature vectors are refined until they uniquely represent the object in the feature vector space. At the end of the training phase, each/either of the trained networks could be used to tell if the new (unseen) symbol is similar to any of the seen (trained) symbols.

The confidence of classification is used to determine the classification applied to the object. For example, if two possible classifications of an object are presented (i.e, 60% chance of classification as a door and 40% classification as a window), the present technology proceeds with the classification which has the greatest confidence.

6.7. Knowledge Representation and Linkage

The outputs of one or more of the object detection and recognition algorithms, semantic segmentation algorithms, text recognition algorithms, and one-shot learning module are passed to a knowledge representation and linkage module. The knowledge representation and linkage module is configured to aggregate, and post-process the aforementioned outputs to form a unified unique representation (high-level representation) for every combination of fed inputs.

This is achieved using a constructive Heuristics unit which is a set of domain-knowledge driven heuristics that form a context-aware decision-making process. This decision-making process (also called hybrid ensemble design) is a learnable component and is often enhanced through reinforcement learning processes, such as those described herein.

The unique (high-level) representations are formed using an iterative process, and the resulting unique representations include the likelihood of occurrence of each low-level feature which comprises the unique representation. These likelihoods are represented as weights associated with each of the low-level features, and the weights can vary between each unique representation.

The confidence score for each low-level feature, plays a key role in nominating the relevant feature vector among the top matches. For example, if the confidence score exceeds a pre-determined threshold, such as 80% then the algorithms may be configured to proceed on the basis that the object is likely to be the object detected. Alternatively, if the confidence score is below a given threshold (such as 80%) then the low-level feature identified may be passed to a human for review.

Figure 7:
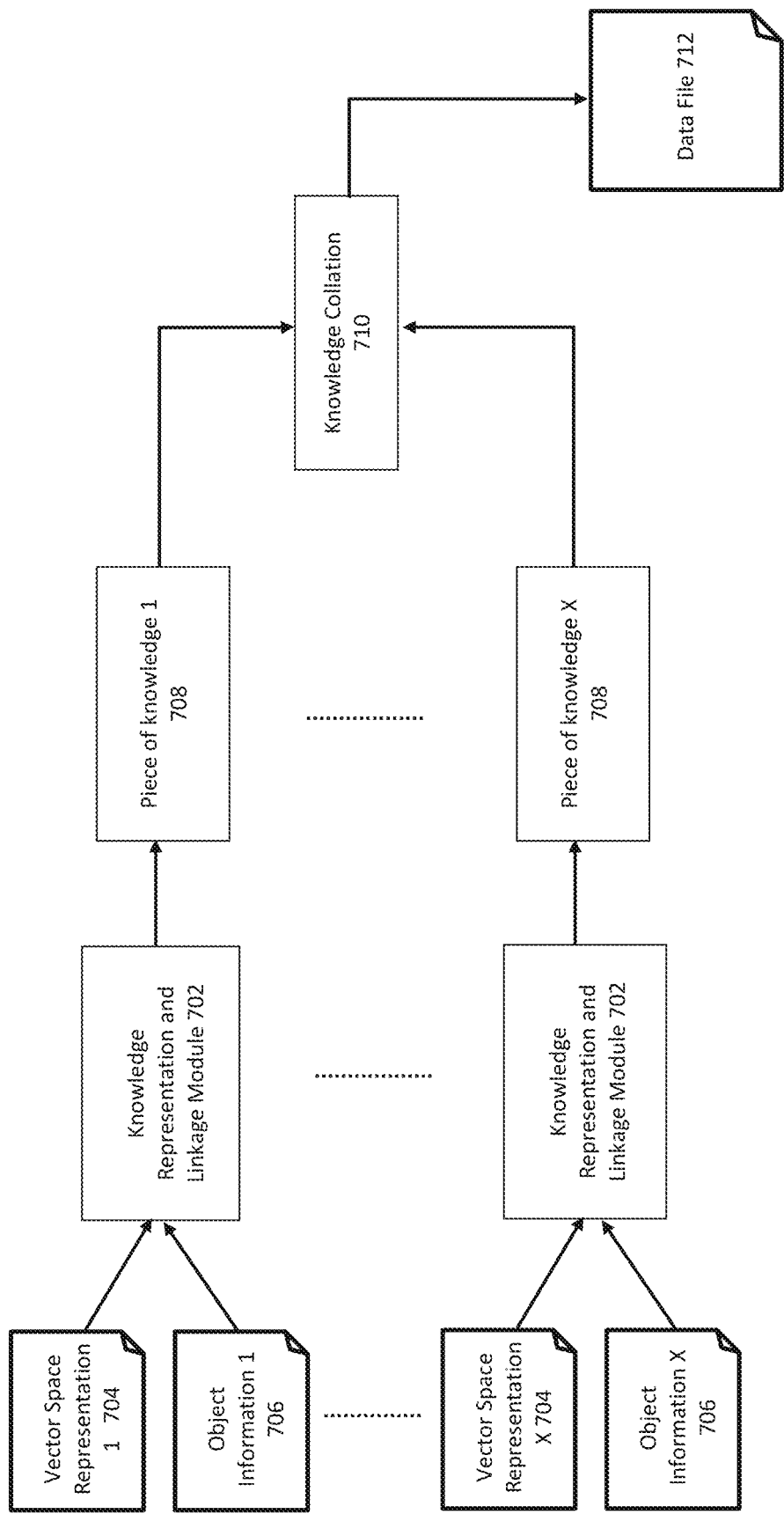
FIG. 7 shows a high-level flow diagram of the knowledge representation and linkage module in accordance with some embodiments.

In practise, the thresholds are adaptive. For example, as more training data is ingested, and the user's confidence in the system increases, these thresholds can be tightened or loosened accordingly. Furthermore, as there are multiple processing modules being used with the present technology, weighting from one module for one feature may be more important to the high-level decisions than another. For example, one or more of the object detection and recognition algorithms may be good at detecting doors, and windows. Accordingly, where these algorithms have a high confidence in accurately detecting an object, other potentially low confidence scores from other modules may be disregarded or have a lower influence on the decision. This fuzzy matching is broadly shown in FIG. 7.

As shown the Knowledge representation and linkage module 702 receives the vector space information 704 from the one-shot learning module, and optionally the object information 706 from the pre-processing algorithms described herein. This is done across all objects and vector space representations identified on the architectural plan. This information is processed using the context-aware decision-making processes described herein to generate unique pieces of knowledge 708 that are ultimately collated 710 to provide the output information or data file 712 described herein.

Objects are then linked to other related objects in the process of forming knowledge. For example, recognised text may be linked to an object based on location, such as a dimension being associated with a door. Other examples include linking a room containing a shower and a sink as a bathroom, or a small room adjacent to a larger room as a wardrobe or closet.

The knowledge representation and linkage module can also include or infer information based on architectural logic, engineering physics, engineering specifications, building code, country, climate etc. For example, in certain countries, the roof pitch, insulation, construction methods etc. must be within certain constraints, and therefore any information not explicitly shown on the plan can be inferred and recorded as a high-level representation or piece of knowledge.

Each time a high-level decision is made—i.e. a piece of knowledge generated—the low-level decision on the feature vectors are revised and in turn the high-level decision making is repeated as shown in FIG. 3. Through this iterative process, both the learnable likelihoods and the decisions are fine tuned. Once the learning process is complete, the high-level representations and the low-level features are expected to remain steady.

The resulting unique representations, and the overarching knowledge representations can be sent to a human for review to minimise concept drift or anomaly occurrences. This can help to prevent imbalances from forming or become worse over time. The result of the human review can be to correct the high-level feature vector space, add a new entry to the high-level feature vector space, or identification of a new design style/concept within the knowledge representation context. This brings the domain knowledge into the decision-making process.

In some cases, because of the human review, a decision may also be made not to update or add a representation to the high-level feature vector space. For example, while an indoor garden in a living room may be a desirable feature for an architect, it is unlikely to be representative of most plans for building construction. Accordingly, it may be advantageous to not update the knowledge representation and linkage module on the rare occasions where this is present.

It should be appreciated that the foregoing representations are reversible allowing for a breakdown of the forming components.

Ultimately the knowledge representation module learns the correlation and similarity between the unique representations and the architectural plan's metadata. In other words, the knowledge representation module decides whether the context-aware representation is seen before and, if so, which metadata is the closest probable match to the fed input. The similarity metrics is a learnable component that takes an ensemble fuzzy matching machine learning design.

Another aspect of the knowledge representation and linkage module is via concepts related to language corpuses. Whilst language corpuses are common, the ability to recognize, extract, and understand key reference and meta-data points within a complex image and text-based document is not. Furthermore, the fully automated approach is believed to be new.

For example, many items are not explicitly written, nor written in natural language, but inferable through images, writings in shorthand, technical language or a number of different visual symbols, synonyms, or abbreviations, and in different languages or for different regions. In other words, methods related to language corpuses, ontologies, word to vector models, image to vector models, and other embodiments are leveraged in combination to achieve this representation.

As part of linkage, the correct combination is achieved by understanding the temporal space within architectural diagrams to correctly link image, text, and specification information together at the relevant parts, given any of these components alone are not useful for estimation. In this hybrid ensemble design, reinforcement learning or other rewards-based learning techniques are used to form correlations or similarities. If the context-aware representation is seen before, it links to the relationship vector and closest possible match.

For example, sometimes the height or width of walls are not explicitly mentioned in text or through dimensions on the architectural plan, but rather are inferred as a result of other points being accurately measured or alluding to a specific area's height or width. The type of window, door, etc. may not be described written or visually, but can be determined from the architectural plan meta-data by linking or inferring information about the build. For example, for a given type of building using a given material construction, the missing information can be inferred to be X or Y. Other examples include roof overhangs, pitches, and truss structures.

Furthermore, this module can be directly written to, allowing manual additions of information completely unrelated to the architectural plans, such as building codes, industry requirements, regional changes, and changes to languages in building, drawing, or construction materials.

6.8. Human in the Loop (HITL)

Where the one-shot learning module is able to identify an object, symbol, segment or text to a predetermined level of confidence. Then this decision is final and can be used to generate the output data. However, in cases where the confidence level is below a predetermined threshold, or conflicts with other information, then it is advantageous to pass this information to a human for review.

The human expert is prompted and leveraged to correct, amend, revise, incorporate, or remove the new feature/symbol/segment/text in the feature vector space and/or corresponding knowledge in the high-level feature vector space.

Similarly, when the knowledge representation model encounters new representations, or determines that there is some inconsistency between the object and expectations based on knowledge, the objects or representations can be passed to a human for review. The human can then approve, correct, amend, revise, or incorporate the new feature or representation in the high-level feature vector space.

Additionally, a human may be used to check the knowledge representations occasionally or periodically for concept drift. Examples include widening the dataset to include multiple toilets in a room (as is common for commercial property) on a high-level feature vector space intended for residential plans. Thereby ensuring the unexpected features continue to be flagged for review.

Any new data that is introduced can be associated with the knowledge representation and/or one-shot learning modules by updating the associated vector spaces. The knowledge representation and one-shot learning modules can then estimate or assess the inputs, and going forward, identify the new data without human intervention.

This provides a method of allowing for ongoing learning which keeps the present technology flexible and adaptable. In particular, the machine learning models, modules and algorithms described herein may be updated to recognise new symbols/segments/text, and accurately extract, measure and count parameters of the new information without being limited to a fixed data set, machine learning approaches or one-shot learning approaches.

Another use of the human in the loop module is for completing the required process of producing an estimate, providing architectural plan comparisons, or generating CAD or BIM files. To achieve this process the present technology can present a complete, or near complete output file to a user/human, and automatically flag or otherwise highlight features which fall below a predetermined confidence level, or where an information inconsistency exists. This can be provided via a user interface where the human/user iterates or steps through each highlighted feature, amending, accepting, rejecting or annotating as required.

The user/human can also review the decisions made by the AI methods described herein, both for concept drift as well as to validate that the decisions have been made correctly. Over time, as confidence in the automatically generated outputs rises, it is expected that the amount of human validation and input should decrease (or eventually stop altogether).

Not only does this process of accepting, rejecting, amending, or annotating update the associated feature vector spaces as described herein, but it also can be used to complete the task of providing the outputs (costed estimate/CAD or BIM file/plan comparison etc.).

Accordingly, the present technology, provides a mechanism for either completely automating the creation of these outputs, or automates a significant portion of the process of generating these outputs. The result being that the amount of human input required is significantly lower than traditional approaches, and the outputs can be provided more quickly and cost effectively than by using the existing approaches to providing these outputs.

The result is rapid, accurate autonomous completion of building estimates, quantity surveying, CAD or BIM model generation and/or architectural plan comparisons.

6.9. Examples of Use

The present technology may be implemented using a wide range of different methods and techniques.

Figure 8:
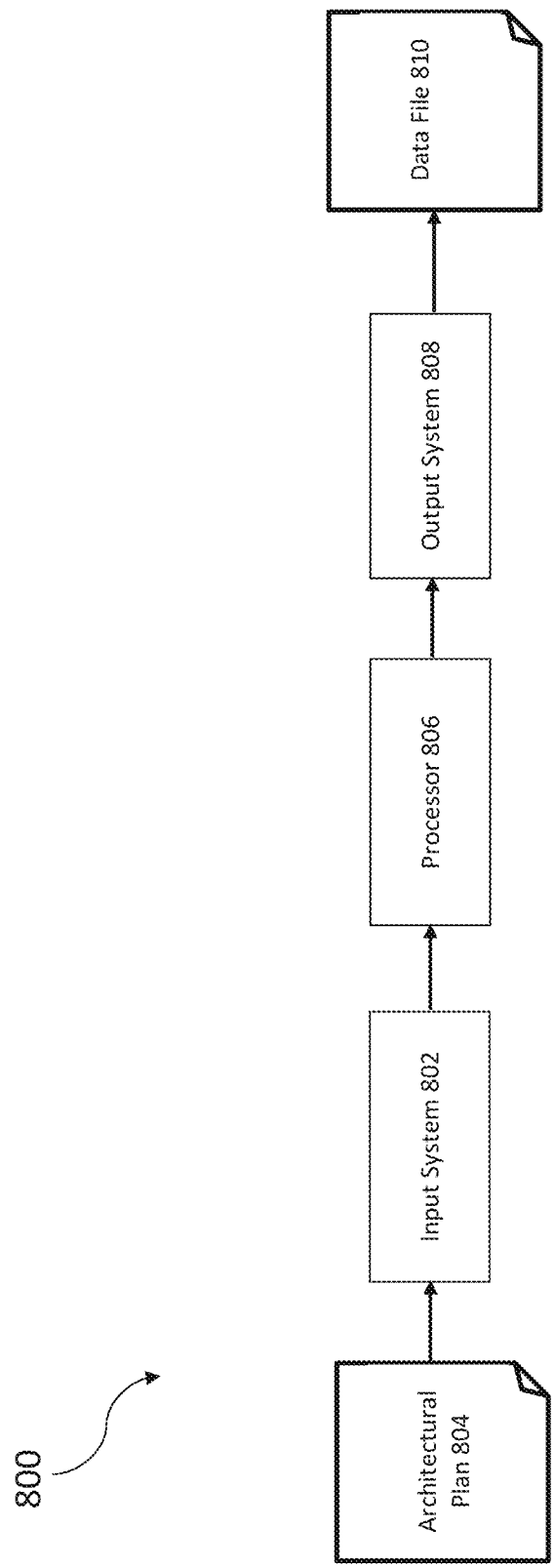
FIG. 8 shows a flow diagram for an architectural plan processing system according to some embodiments.

One example of a processing system 800 according to one aspect of the present embodiment is shown in FIG. 8. In broad terms the plan processing system 800 comprises an input system 802 configured to receive an architectural plan 804, a processor 806 configured to process the architectural plan 804, and an output system 808 configured to output a data file 810.

The processing system 800, can comprise any suitable input system 802 known to those skilled in the art. For example, a plan for building construction, such as an architectural plan 804 may be provided to the processor 806 via a web interface, such as by uploading a file containing the architectural plan 704. Alternatively, the architectural plan 804 may be provided by inputting (e.g. downloading or uploading) a file to an application running on a computer. For example, the architectural plan 804 may be provided as a pdf file.

The processor 806, is configured to execute machine readable code to perform one or more processing steps as described herein. For example, the processor 806 can be configured to provide any one or more of object detection and recognition, semantic segmentation, text recognition, one-shot learning, and knowledge representation as described herein.

In an example, the processor 806 is hosted on a remote server, such as a cloud server which allows remote access to the processor 806. In other examples, the processor 806 may be configured to process a file on a local machine such as a computer.

The architectural plan processing system 800, is configured to outputs a data file 810 via an output system 808. The output system 808 can include any suitable output means such as an electronic display, printer, or file. For example, the data file 810 may be presented on an electronic display, printed and/or available to be downloaded or saved to a storage means such as a hard-drive, cloud storage service, or removable storage device.

The data file 810 can contain any one or more of the following sets of information:

- Object information such as the walls on the architectural plan, including their location, dimensions (including height, width and length), whether they are load bearing, how they are constructed, and the materials used in their construction.
- Object information such as the windows shown on the architectural plan, including their location, dimensions, materials, construction (including whether double glazed), tinting, and style.
- Object information such as the doors shown on the architectural plan, including their location, size, which direction they are configured to swing, and where they are hinged, material and style.
- Information regarding framing construction, such as the location of top plates, sole plates, headers, trimmers, studs, sills, rafters, joints, bearers, nogging, studs, posts, etc.
- Any other relevant information including (but not limited to), roofing/truss features, floor features, engineering features including wiring, plumbing, gas, etc. house fixtures, furniture and fittings, etc.

This information can be present in any machine or human readable format, including but not limited to binary files, text files, JavaScript Object Notation (JSON), or Comma-separated variable (CSV) files.

From here the data file may be processed by software configured to:

- Present the information about the architectural plan to a human reviewer.

Generate a two-dimensional or three-dimensional model of the building shown on the architectural plan.

Compare the information with costing information to provide a costed estimate.

Compare the data file with another data file or architectural plan to identify differences.

Compare the data file with a repository of architectural plans to determine which plans most closely correspond to the plan in the data file.

This data file 810 processing may be performed by the processor 806 which generates the file. Alternatively, the data file 810 may be provided to another processor or application configured to perform any one of the further processing steps described herein.

Example Data File

One example of output information in the form of a data file 810 illustrating just one object is shown in JSON format below:

```
{
  "levels": [
    {
      "frames": [
        {
          "centreline_end": [18436.180240365164, 5152.118440504126, 0],
          "centreline_start": [16122.212945852116, 5152.118440504126, 0],
          "column": false,
          "exterior_normal": [0.0, -1.0],
          "external": true,
          "height": 2720.0,
          "load_bearing": false,
          "openings": [ ],
          "perimeter": [ [16077.212945852116, 5107.118440504126], [18481.180240365164, 5107.118440504126], [18481.180240365164, 5197.118440504126], [16077.212945852116, 5197.118440504126], [16077.212945852116, 5107.118440504126] ],
          "thickness": 90.0
        },...
```

It should be appreciated that the foregoing representation is shown by way of example, only and any method of representing the information in the data file 810 may be used without departing from the spirit and scope of the technology.

As shown the data file 810 includes a classification which identifies the object. In the example shown above the object is classified as framing. The precise locations and dimensions of the framing are outlined, together with information such as whether the framing is load bearing, whether it is an internal or external wall, and whether the section of framing includes any openings.

This information together with information on the other objects in the data file constitutes a complete breakdown of the objects on the architectural plan. This breakdown can then be used to provide an accurate costed estimate, three-dimensional building model, or information breakdown for human analysis as described herein.

Costed Estimates

One advantage of the present technology is to provide complete, or highly detailed costed estimates very quickly and cost-effectively for a construction project based on the architectural plan. Accordingly, in one example of the technology, the information output by the processing system can be passed to a human estimator or processing system configured to collate material costs against each of the objects identified on the architectural plan.

These costed estimates generally include a summary of the high-level elements of the build, such as an overall cost total for pre-nailed framing components, and low-level breakdowns of the components and materials used in the high-level elements. Table 1 provides an example of a high-level cost summary for a residential housing build, while Table 2 provides an example breakdown of the midfloor framing component of the build.

TABLE 1

High-Level Cost Estimate Summary

| Building Stage | Sub Total |
| --- | --- |
| Pre-nailed frames (Ground Level) | $11,931.11 |
| Pre-nailed frames (Level 1) | $ 8,123.10 |
| Trusses | $ 6,214.98 |
| Precut Balance of Roof | $ 1,278.52 |
| Midfloor Framing | $ 5,875.81 |
| Midfloor Hardware | $ 3,883.01 |
| Framing Hardware | $  210.13 |
| Misc Supply (Ground Level) | $ 1,144.91 |
| Misc Supply (Level 1) | $  772.44 |
| Misc Supply (Balance of Roof) | $ 4,226.69 |
| Estimate Sub Total | $43,629.66 |

TABLE 2

Midfloor Framing Cost Estimate Breakdown

| Midfloor Framing | Qty | Unit | Rate | Price |
| --- | --- | --- | --- | --- |
| 190 × 45 RADIATA MSG8 STRESS GRADED H1.2 KD *EMS*. UB PLATE | 6.2 | MTR | $7.33 | $   45.45 |
| 240 × 45 RADIATA MSG8 STRESS GRADED H1.2 KD *EMS*. BEAM | 70.6 | MTR | $9.10 | $  642.46 |
| 240 × 45 RADIATA MSG8 STRESS GRADED H1.2KD*EMS*. F/JOISTS | 355.5 | MTR | $9.10 | $3,235.05 |
| 240 × 45 RADIATA MSG8 STRESS GRADED H1.2 KD *EMS*. FLOOR NOGS | 55.6 | MTR | $9.10 | $  505.96 |
| 240 × 45 RADIATA MSG8 STRESS GRADED H1.2 KD *EMS*. SOLID BLOCKING | 38.9 | MTR | $9.10 | $  353.99 |
| 240 × 45 RADIATA MSG8 STRESS GRADED H1.2 KD *EMS*.TRIM | 53.1 | MTR | $9.10 | $  483.21 |
| 240 × 45 RADIATA MSG8 STRESS GRADED H1.2 KD *EMS*. UB PLATE | 30.2 | MTR | $9.10 | $  274.82 |
| 190 × 45 RADIATA MSG8 STRESS GRADED H1.2 KD *EMS*. UB PLATE | 7.2 | MTR | $7.33 | $   52.78 |
| 240 × 45 RADIATA MSG8 STRESS GRADED H1.2 KD *EMS*. UB PLATE | 31 | MTR | $9.10 | $  282.10 |
| Subtotal | | | | $5,875.81 |

Generation of costed estimates from the data files described herein requires acquiring cost information for the materials and objects identified in the plan. Existing costing databases exist which contain the aforementioned data. Accordingly, generation of the costing requires determining the materials used, looking up the cost for the material, multiplying the cost by the total amount of material required.

It should be appreciated that material costing databases are commonly held by material suppliers, and are generally accessible via spreadsheets, online logins on APIs, as should be familiar to those skilled in the art.

CAD and BIM Modelling

One advantage of the present technology is the ability to convert flat architectural plans into detail rich CAD or BIM models. For example, the output of the processing system can be used to generate CAD or BIM models using the output information contained in a data file as described herein. These CAD or BIM models can be used to easily present information about architectural plans and allows for customisation of what is presented at any given time.

For example, with a CAD or BIM file it is possible to easily visualise specific aspects, such as filtering to only show walls, windows or doors. Objects on the architectural plan can also be colour coded to add visual depth to the plans.

Examples of CAD and BIM files should be familiar to those skilled in the art, examples including: DXF, DWG, IFC, STEP, STL, IGES, QIF, JT, PDF, ACIS, PARASOLID etc.

A key advantage of this technology is the ability to present the building information to a client in a way which is highly presentable and easy to understand.

Two-Dimensional Modelling

Figure 9A:
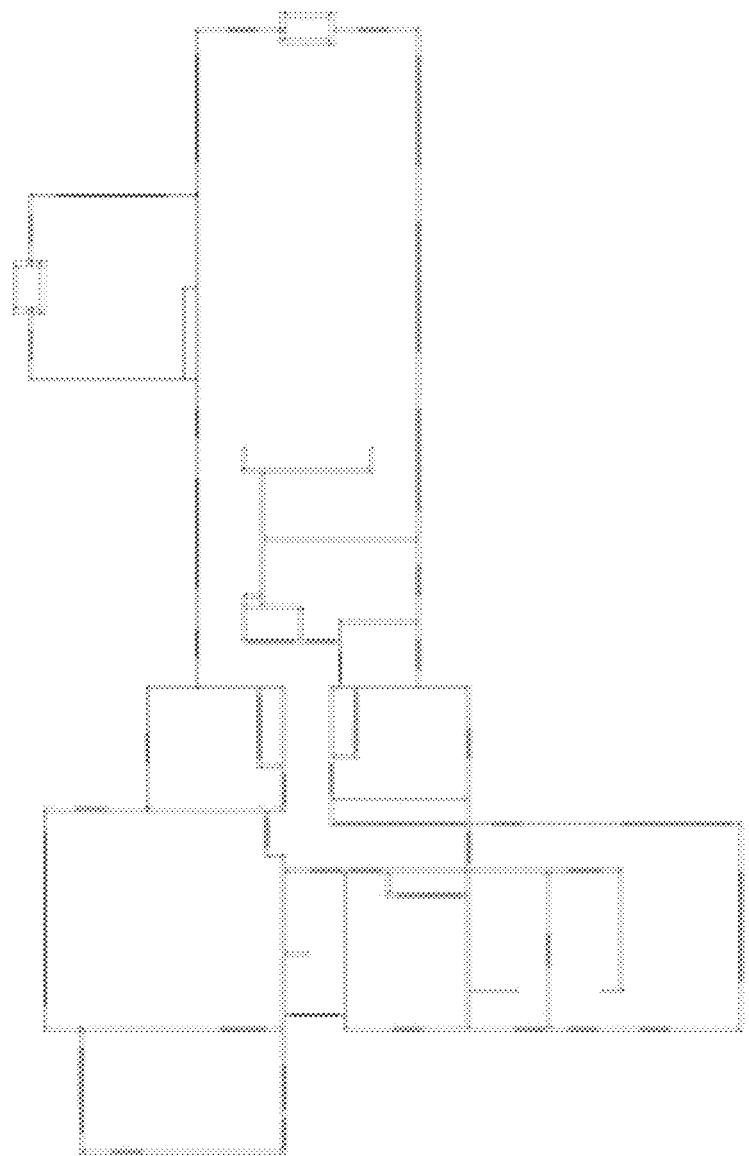
FIG. 9A shows a two-dimensional CAD file synthesised from an architectural plan in accordance with some embodiments.

One example of a two-dimensional CAD file which has been generated using the present technology is shown in FIG. 9A. The example shown has been filtered to only show the wall framing, and as such allows for a simpler, less cluttered means of presenting specific information on the architectural plan.

The techniques for generating a two-dimensional CAD file from the data files described herein is straightforward as the data file contains each object listed, together with their exact location and dimensions on the architectural plan.

Three-Dimensional Modelling

Figure 9B:
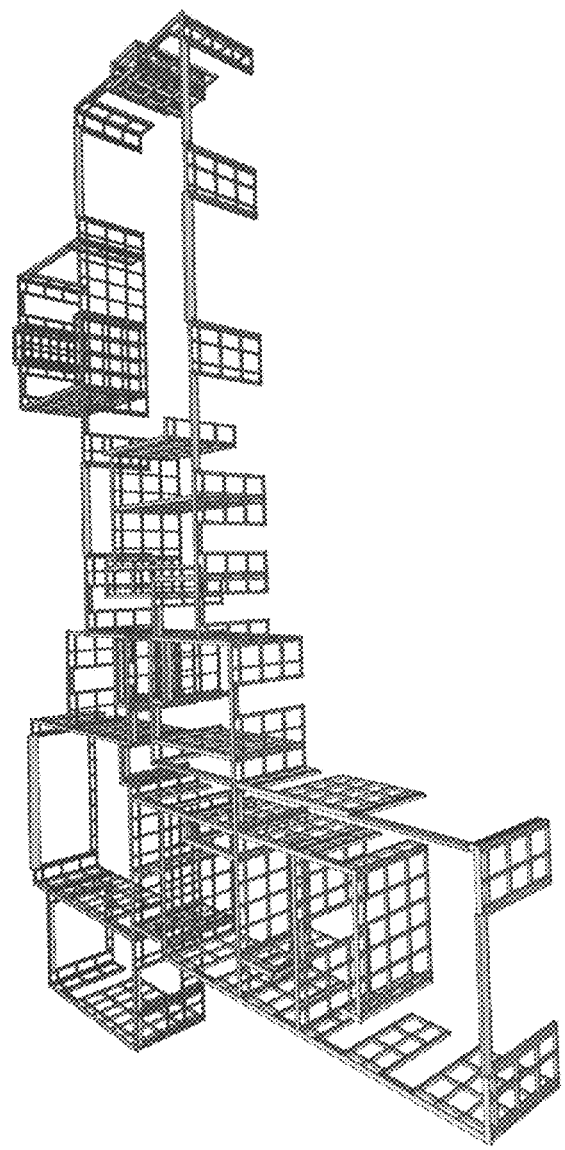
FIG. 9B shows a three-dimensional building module generated from an architectural plan in accordance with some embodiments.

One example of a three-dimensional BIM file which has been generated using the present technology is shown in FIG. 9B. Again, the example has been filtered to only show the wall framing, and objects such as the windows, roof framing, electrical, plumbing, fascia, walls and doors etc. have been hidden from view in order to simplify the presentation of information.

The techniques for generating a three-dimensional BIM or CAD file from the data files described herein is straightforward as the data file contains each object listed, together with their exact location and dimensions on the architectural plan. For example, the present technology may be used to covert an output (data) file to any appropriate CAD or BIM format including: IFC, RVT, NWD, DWG, DXF, etc.

The ability to generate three-dimensional BIM or CAD files from an architectural plan may be particularly advantageous to show a client or customer what the completed building will look like, without needing to understand the complex architectural plans.

Information Presentation

Another advantage of generating information rich image files, CAD files, or BIM files is the ability to easily present information to a human reviewer. This can be done for the purposes of integrating new objects, text and symbols as described in relation to the Human-in-the-loop module above, or for simply validating the accuracy of the data file. For example, a human reviewer can choose which objects to display at any given time to validate that the algorithms described herein have correctly identified and classified the objects on the architectural plan.

Figure 10A:
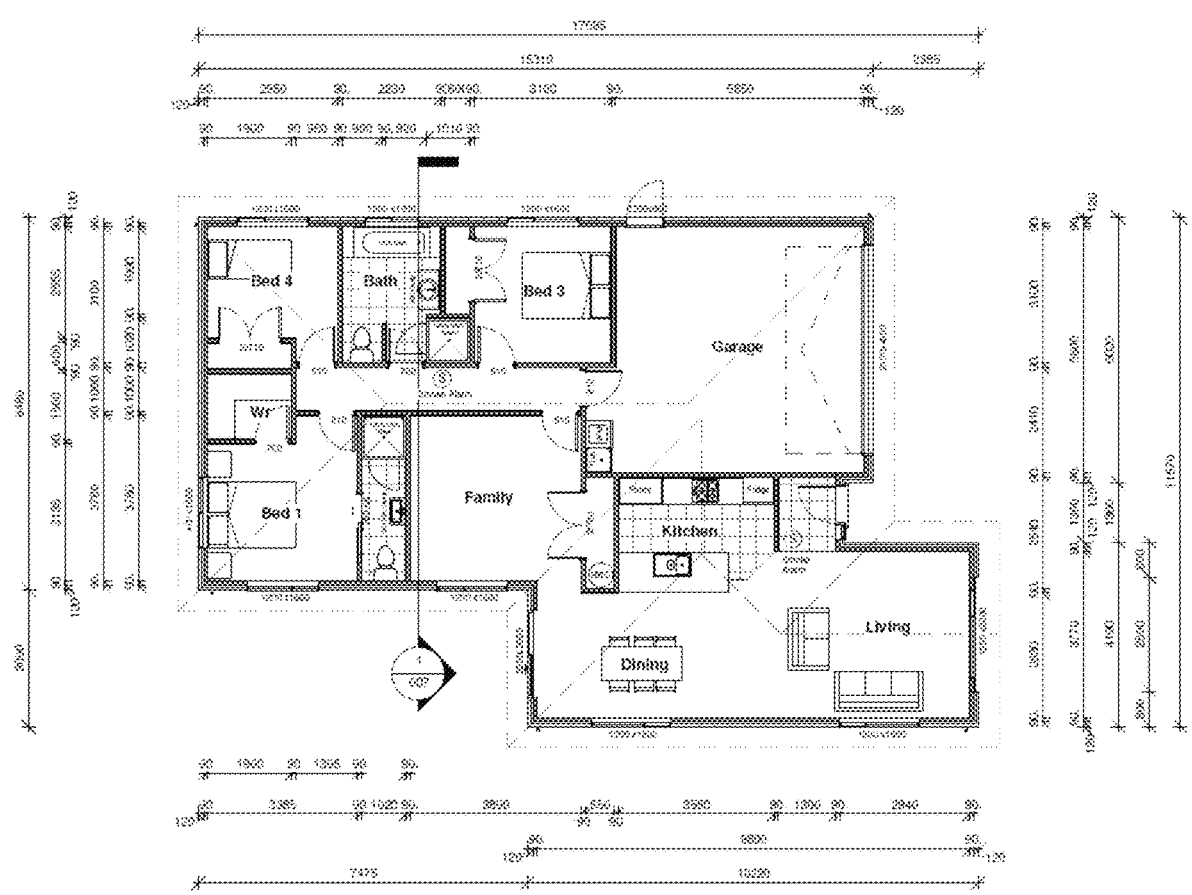
FIG. 10A shows a processed architectural plan in accordance with some embodiments.
Figure 10B:
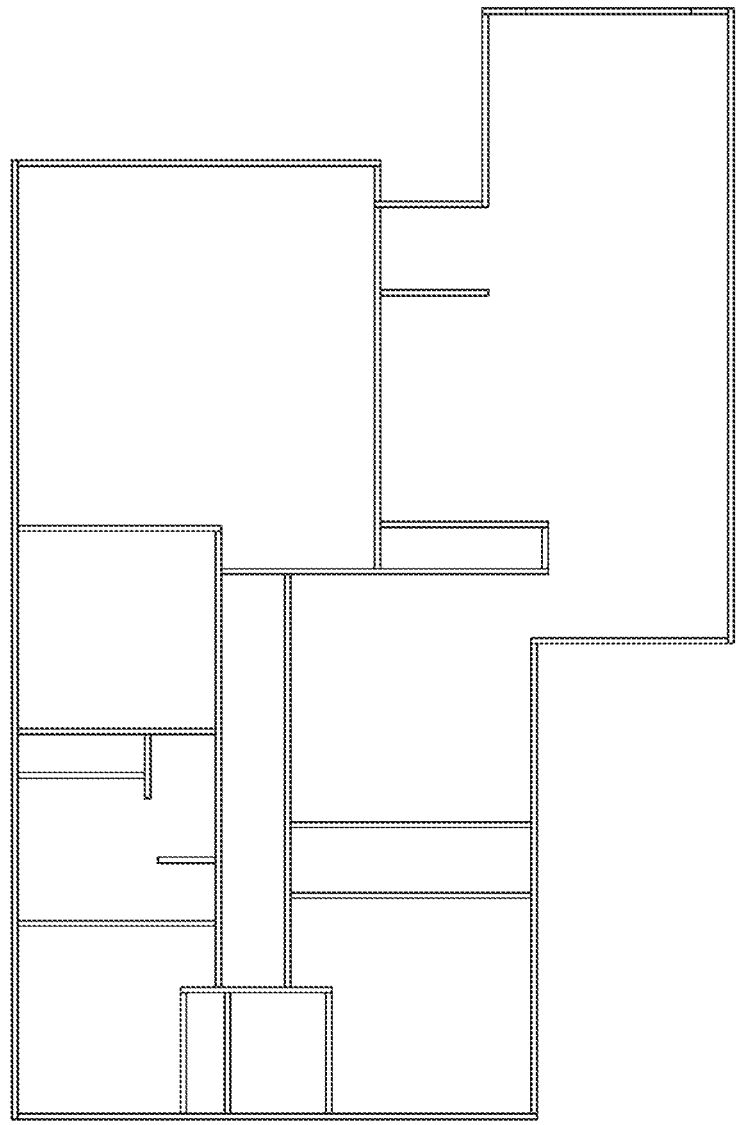
FIG. 10C shows the door objects of the architectural plan of FIG. 10A according to some embodiments.
FIG. 10D shows the window objects of the architectural plan of FIG. 10A according to some embodiments.
FIG. 10E shows the roofline objects of the architectural plan of FIG. 10A according to some embodiments.
Figure 10D:
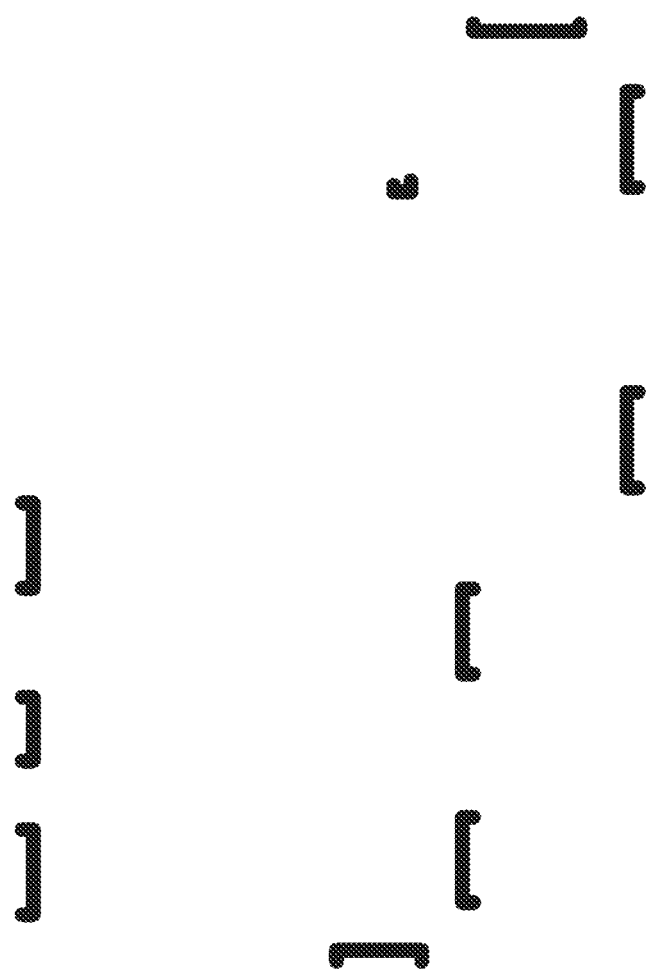
Figure 10E:
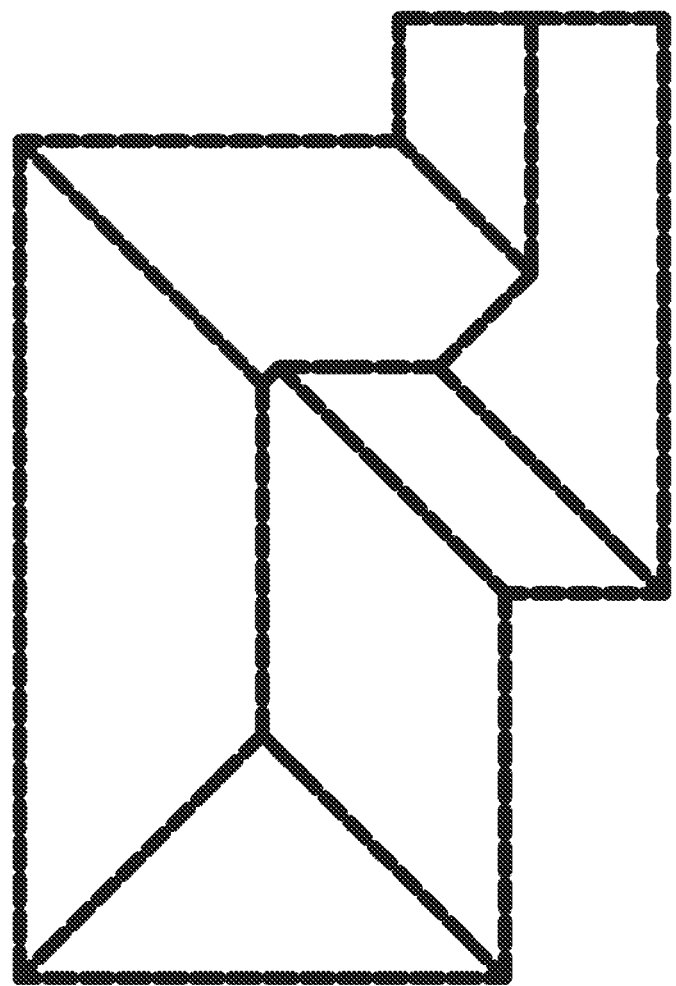

FIG. 10A shows one example of an architectural plan which has been processed by the present technology. Once the architectural file has been processed, the resulting output can be used to provide filtered views of the architectural plan. For example, FIG. 10B shows the same architectural plan with only the walls shown. Similarly, FIGS. 10C, 10D and 10E show the doors, windows, and roofline respectively.

Using these filtered views allows for quick identification of features which have been incorrectly classified. For example, a person can quickly look at the wall view of FIG. 9B and identify any features which may have been incorrectly classified as a wall.

Additionally, the present technology may be used to provide output information to one or more software packages, including integrated software, external software packages and third-party software. For example, by exporting data, providing application programming interfaces (APIs), or by integrating the software, the present technology can be used for project management, pre-construction processes, cost management, in depth plan visualisation, and architectural design.

Architectural Plan Comparison

During the design of a building, architectural plans are often modified to meet the client's needs. Unfortunately, as the architectural plans often span 50 or more pages, identifying these changes and determining what the implications these changes will have on the build is difficult, time consuming and costly.

The present technology can overcome or at least minimise these issues by allowing for fast comparison of architectural plans. For example, two or more architectural plans can be compared, and any differences between the plan's pages are quickly identified by comparing the locations, dimensions, materials, or style of objects on the plan.

The result can be communicated to a human reviewer, by any one or more of:
  Highlighting or otherwise identifying the difference on a user interface, or on the architectural plan itself.
  Providing a data file summarising the changes. For example, a text, JSON or CSV file which highlights the differences.

For example, the present technology may provide a marked-up version of an architectural plan which highlights or otherwise emphasises the difference between one or more architectural plans. For example, by using colour, shading, bolding, masking, adjusting contrast, hiding unchanged features, or any other suitable technique for contrasting the differences.

Repository Comparison

Another feature of the present technology is the ability to compare an architectural plan against a repository of similar plans and return information about the architectural plan which most closely matches. Alternatively, it may be advantageous to return a plurality of results, such as the 10 architectural plans which most closely match the architectural plan provided.

The present technology can compare these architectural plans using parameter or combinations of parameters such as:
  Total floor area;
  Design elements;
  Structural elements; and
  Number of floors.

In this way, information can be presented to a customer or client which summarises potential changes they may like to make to the plan, based on what other people have done. In addition, the present technology can quickly summarise and compare the differences these changes would make from a costing and project delivery perspective.

Accordingly, the present technology allows for fast, detailed feature vector comparison of architectural plans, to rapidly identify and report on differences. This approach is faster and more accurate than existing technologies due to the limitations in existing computer vision technologies (such as object overlap) as described herein.

6.10. Disclaimer

The foregoing technology may be said broadly to consist in the parts, elements and features referred to or indicated in the specification of the application, individually or collectively, in any or all combinations of two or more of said parts, elements or features.

Aspects of the present technology have been described by way of example only and it should be appreciated that modifications and additions may be made thereto without departing from the scope thereof as defined in the appended claims.

6.11. Other Embodiments

Some embodiments relate to generating three dimensional virtual representations of a building construction structure based on two-dimensional real-world construction plans, such as architectural plans or building plans. Some embodiments further produce autonomous, near real-time, and highly accurate and comprehensive building take-offs, complete construction detailing or estimates, detailed bill of materials, plan analysis (including detection of a number of non-standardized objects, such as doors or windows), as well as transforming 2D drawings into 3D and/or providing Building Information Modeling (BIM). The two dimensional real-world architectural plan can include multivariate non-standardized architectural symbols, which define numerous objects including trees, bathrooms, doors, stairs, windows, and floor finishes, lines, including solid, hollow, dashed and dotted lines, which define features including internal or external walls, windows, doors, stairs, property boundaries, easements, footpaths, rooflines, driveways, rights of way, paving stones, landscaping, water, power, drainage, and dimensions, shading, and patterns which define materials and areas on the two dimensional real-world architectural plan, and text which indicate the purposes of the rooms, dimensions, features, construction methods, and regulatory standards.

Each of the processes, methods, and algorithms described in the preceding sections may be embodied in, and fully or partially automated by, code modules executed by one or more computer systems or computer processors comprising computer hardware. The code modules may be stored on any type of non-transitory computer-readable medium or computer storage device, such as hard drives, solid state memory, optical disc, and/or the like. The systems and modules may also be transmitted as generated data signals (e.g., as part of a carrier wave or other analog or digital propagated signal) on a variety of computer-readable transmission mediums, including wireless-based and wired/cable-based mediums, and may take a variety of forms (e.g., as part of a single or multiplexed analog signal, or as multiple discrete digital packets or frames). The processes and algorithms may be implemented partially or wholly in application-specific circuitry. The results of the disclosed processes and process steps may be stored, persistently or otherwise, in any type of non-transitory computer storage such as, e.g., volatile or non-volatile storage.

The various features and processes described above may be used independently of one another, or may be combined in various ways. All possible combinations and subcombinations are intended to fall within the scope of this disclosure. In addition, certain method or process blocks may be omitted in some implementations. The methods and processes described herein are also not limited to any particular sequence, and the blocks or states relating thereto can be performed in other sequences that are appropriate. For example, described blocks or states may be performed in an order other than that specifically disclosed, or multiple blocks or states may be combined in a single block or state. The example blocks or states may be performed in serial, in parallel, or in some other manner. Blocks or states may be added to or removed from the disclosed example embodiments. The example systems and components described herein may be configured differently than described. For example, elements may be added to, removed from, or rearranged compared to the disclosed example embodiments.

Conditional language used herein, such as, among others, "can," "could," "might," "may," "e.g.," and the like, unless specifically stated otherwise, or otherwise understood within the context as used, is generally intended to convey that certain embodiments include, while other embodiments do not include, certain features, elements and/or steps. Thus, such conditional language is not generally intended to imply that features, elements and/or steps are in any way required for one or more embodiments or that one or more embodiments necessarily include logic for deciding, with or without author input or prompting, whether these features, elements and/or steps are included or are to be performed in any particular embodiment. The terms "comprising," "including," "having," and the like are synonymous and are used inclusively, in an open-ended fashion, and do not exclude additional elements, features, acts, operations, and so forth. Also, the term "or" is used in its inclusive sense (and not in its exclusive sense) so that when used, for example, to connect a list of elements, the term "or" means one, some, or all of the elements in the list. Conjunctive language such as the phrase "at least one of X, Y and Z," unless specifically stated otherwise, is otherwise understood with the context as used in general to convey that an item, term, etc. may be either X, Y or Z. Thus, such conjunctive language is not generally intended to imply that certain embodiments require at least one of X, at least one of Y and at least one of Z to each be present.

While certain example embodiments have been described, these embodiments have been presented by way of example only, and are not intended to limit the scope of the disclosure. Thus, nothing in the foregoing description is intended to imply that any particular element, feature, characteristic, step, module, or block is necessary or indispensable. Indeed, the novel methods and systems described herein may be embodied in a variety of other forms; furthermore, various omissions, substitutions and changes in the form of the methods and systems described herein may be made without departing from the spirit of the inventions disclosed herein. The accompanying claims and their equivalents are intended to cover such forms or modifications as would fall within the scope and spirit of certain of the inventions disclosed herein.

It should be emphasized that many variations and modifications may be made to the above-described embodiments, the elements of which are to be understood as being among other acceptable examples. All such modifications and variations are intended to be included herein within the scope of this disclosure.

The invention claimed is:

1. A structural building design system for processing, analysing, and interpreting holistically a multipage set of two-dimensional (2D) real-world building construction plans for a building and yielding near real time accurate material type, quantity, and specification outputs as required for construction of a compliant building from said plans, through computationally generating a future feature vector space dataset, the system comprising:

one or more processors configured to:
- train a neural network using one or more initial two-dimensional real-world architectural plans to extract characteristic features for objects in the one or more initial two-dimensional real-world architectural plans, recognize the objects based on the characteristic features, and interpret, from said characteristic features, corresponding requirements for constructing the objects, the objects comprising:
  - architectural symbols,
  - lines,
  - shading, and
  - text;
- receive a two-dimensional real-world architectural plan for construction of a structural building, wherein the two-dimensional real-world architectural plan includes the objects;
- perform pre-processing, of characteristics associated with the objects on the two dimensional real-world architectural plan to perform pixel by pixel classification of the objects, wherein the pre-processing comprises two or more of object detection and recognition, semantic segmentation, or text recognition to identify a plurality of objects on the two dimensional real-world architectural plan and the characteristic features thereof;
- apply the characteristic features as inputs to the trained neural network to:
  - computationally transform at least one characteristic features of learned detected objects into a numerical representation that forms part of a future vector space dataset; and
  - wherein said transformations for learned and unlearned detected objects have both high level and low level classifications of identified characteristic features;
  - perform a comparison of the future feature vector space dataset for the detected objects to confirm the learned objects and unlearned objects meet a pre-determined confidence level for the classification of each detected object; and
  - perform a correlation analysis of the characteristic features for detected objects meeting the pre-determined confidence level, wherein the comparison of the future vector space and the correlation analysis includes one or more of: determining a shape, positioning pre-processing to detect size on a pixel by pixel basis to provide output information regarding the 2D plan including producing autonomous creation of at least one of the following outputs:
    - near real time accurate building takeoffs,
    - complete construction detailing,
    - complete construction estimates,
    - detailed bill of materials for the construction of the building, or
    - a document summarizing or showing differences or similarities between building plans.

2. The structural building design system as claimed in claim wherein training data used to train one or more algorithms, is generated using a generative adversarial network (GAN).

3. The structural building design system as claimed in claim 1, wherein vectorisation of the detected objects is performed using a feature vector space or hierarchical machine learning model, including but not limited to one-shot, zero-shot or few-shot learning.

4. The structural building design system as claimed in claim 1, wherein the learned feature vector space is generated using a machine learning technique, including at least one of: supervised learning, unsupervised learning, semi-supervised learning, transfer learning, or reinforcement learning.

5. The structural building design system as claimed in claim 1, wherein the characteristic features in the low-level feature vector space are provided to a knowledge representation and linkage module configured to perform ensemble fuzzy matching to identify concepts including architectural objects, doors, windows, walls, load bearing structures, rooms, materials, and a building structure, the resulting concepts being stored in a high-level vector space.

6. The structural building design system as claimed in claim 5, wherein the identification of concepts is performed using one or more of: architectural logic, engineering physics, engineering specifications, building code, country specific knowledge, or climate specific knowledge.

7. The structural building design system as claimed in claim 5, wherein in response to determining that the high-level vector spaces and/or its associated models are updated, the one or more processors are configured to retrain one or more of the pre-processing, vectorisation, and/or knowledge representation or linkage models.

8. The structural building design system as claimed in claim 1, wherein in response to determining that the low-level vector space or its associated models are updated, the one or more processors are configured to retrain one or more of the pre-processing, vectorisation, and/or knowledge representation or linkage models.

9. The structural building design system as claimed in claim 1, wherein the analysis comprises measurement of at least one feature or object on the two dimensional real-world architectural plan using one or more of:
- determining scale of features on the two dimensional real-world architectural plan;
- optionally pixel counting;
- classified object counting; or
- text recognition.

10. The structural building design system as claimed in claim 1, wherein the output information comprises one or more of:
a) object identification,
b) object counts,
c) scale,
d) dimensions,
e) locations,
f) materials,
g) costs,
h) a computer-aided design (CAD) file,
i) a building information modelling (BIM) file,
j) a list of one or more comparable building construction plans,
k) a comparison of the differences between one or more building construction plans,
l) A marked-up version of the building construction plan, highlighting one or more features on the building construction plan, or
m) data configured to be received by another software application for purposes of project management, cost management, visualisation or construction review.

11. A computer implemented Artificial Intelligence (AI) method for deriving, extracting and verifying and manipulating information holistically from a multipage set of two dimensional real-world architectural plan and providing real-world outcomes from said 2D plan for a building and yielding near real time accurate material type, quantity, and specification outputs as required for construction of a compliant building from said plans, the method comprising:

(a) training a neural network using one or more initial two-dimensional real-world architectural plans to extract characteristic features for objects in the one or more initial two-dimensional real-world architectural plans, recognize the objects based on the characteristic features, and interpret, from said characteristic features, corresponding requirements for constructing the objects, the objects comprising:
architectural symbols,
lines,
shading, and
text;

b) receiving a two dimensional real-world architectural plan for a building construction of a structural building via an input system;

c) performing pre-processing of characteristics associated with an object on the two dimensional real-world architectural plan, where the pre-processing comprises one or more of object detection and recognition, semantic segmentation, or text recognition to identify a plurality of objects on the two dimensional real-world architectural plan;

d) apply the characteristic features as inputs to the trained neural network to:
computationally transforming the characteristic features of the detected objects into a numerical representation that forms part of a future vector space dataset to form a low-level future feature vector space dataset;

a) comparing the future feature vector space dataset against a learned feature vector space dataset to determine a confidence level for the classification of each detected object, b) performing a correlation analysis of the characteristic features for objects that meet a pre-determined confidence level to determine one or more items or materials required to construct the building; and c) outputting one or more of:
near real time accurate building takeoffs,
near real time complete construction detailing or complete building cost estimates,
detailed bill of materials for the construction of the building, or
plan analysis.

12. The method as claimed in claim 11, wherein the two dimensional real-world architectural plan for building construction is a compliant building plan provided to the input system as an electronic document as a PDF document, image file or collection of image files.

13. The method as claimed in claim 11, wherein one or more of the object detection and recognition, semantic segmentation or text recognition comprise algorithms are trained using one or more machine learning approaches including: supervised learning, unsupervised learning, semi-supervised learning, transfer learning, and reinforcement learning.

14. The method as claimed in claim 13, wherein training data used to train the one or more algorithms, is generated using a generative adversarial network (GAN).

15. The method as claimed in claim 11, wherein vectorisation of the detected objects is performed using a feature vector space or hierarchical machine learning model, including one-shot, zero-shot or few-shot learning.

16. The method as claimed in claim 11, wherein the learned feature vector space is generated using a machine learning technique, including at least one of: supervised learning, unsupervised learning, semi-supervised learning, transfer learning, or reinforcement learning.

17. The method as claimed in claim 11, further comprising: g) providing the characteristic features in the low-level feature vector space to a knowledge representation and linkage module configured to perform ensemble fuzzy matching to identify concepts including architectural objects, doors, windows, walls, load bearing structures, rooms, materials, or a building structure, the resulting concepts being stored in a high-level vector space.

18. The method as claimed in claim 17, wherein the identification of concepts is performed using one or more of: architectural logic, engineering physics, engineering specifications, building code, country specific knowledge, or climate specific knowledge.

19. The method as claimed in claim 11, wherein in response to determining that at least one of the high-level vector space or its associated models is updated, the method comprises retraining one or more of the pre-processing, vectorisation, and or knowledge representation or linkage models.

20. The method as claimed in claim 11, wherein in response to determining that at least one of the low-level vector space is or its associated models is updated, the method comprises retraining one or more of the pre-processing, vectorisation, and or knowledge representation or linkage models.

21. The method as claimed in claim 11, wherein the analysis comprises measurement of at least one feature or object on the two dimensional real-world architectural plan using one or more of:
determining scale of features on the two dimensional real-world architectural plan,
optionally pixel counting,
classified object counting, or
text recognition.

22. The method as claimed in claim 11, further comprising: g) collating the one or more items, or materials to provide output information including one or more of:
i) object identification,
ii) object counts,
iii) scale,
iv) dimensions,
v) locations,
vi) material requirements, including type, dimensions and amounts,
vii) a cost estimate,
viii) a computer-aided design (CAD) file,
ix) a building information modelling (BIM) file,
x) a list of one or more comparable building construction plans,
xi) a comparison of the differences between one or more building construction plans,
xii) a marked-up version of the building construction plan, highlighting one or more features on the building construction plan, or
xiii) data configured to be received by another software application for purposes of project management, cost management, visualisation or construction review.

23. A computer implemented AI method for preparing a complete detailing and/or complete detail level cost estimate from a real-world architectural plan for building construction of a building, comprising:

a) train a neural network using one or more initial two-dimensional real-world architectural plans to extract characteristic features for objects in the one or more initial two-dimensional real-world architectural plans, recognize the objects based on the characteristic features, and interpret, from said characteristic features, corresponding requirements for constructing the objects, the objects comprising:
architectural symbols,
lines,
shading, and
text;
b) accessing a learned feature vector space dataset of real-world architectural plans for building construction, said feature vector space dataset comprising at least one of feature vectors for a plurality of real-world architectural plans or vectors from a plurality of object vectors;
c) processing a real-world architectural plan to create new feature space vectors dataset via computationally transforming at least one characteristic feature of the objects into a mathematical representation thereof to form part of a future feature vector space dataset;
d) apply the characteristic features as inputs to the trained neural network to:
   a) comparing the new feature space mathematical representations from the real-world architectural plan to the learned feature vector space dataset and using one or more one-shot, zero-shot or few-shot algorithm(s) to recognise the objects in the real-world architectural plan;
   b) performing a comparison of the future feature vector space dataset for correlations with the detected objects meeting a predetermined confidence level for the classification of each detected object,
   c) analysing the recognised objects to determine the items/materials required for constructing the building and the costs of said items/materials; and
   d) providing within near real-time of step d) one or more of:
     i) accurate building takeoffs,
     ii) complete construction detailing or complete building cost estimates,
     iii) detailed bill of materials for the construction of the building, or
     iv) plan analysis.

24. The AI method as claimed in claim 23, further comprising:
   f) accessing one or more product supplier databases to match the items/materials from step d) against products; and
   g) accessing one or more pricing databases match the products against the prices in order to provide a cost estimate.

25. The AI method as claimed in claim 23, wherein the learned feature vector space is trained using a collection of objects sourced from at least 10,000 different plans for building construction.

26. The AI method as claimed in claim 23, further comprising: f) providing the object feature vectors to a knowledge representation and linkage module configured to perform ensemble fuzzy matching to generate high-level representations about the plan using one or more of: architectural logic, engineering physics, engineering specifications, building code, country specific knowledge, or climate specific knowledge.

27. The method as claimed in claim 23, further comprising: f) collating the one or more items, or materials to provide output information including one or more of:
   i) object identification,
   ii) object counts,
   iii) scale,
   iv) dimensions,
   v) locations,
   vi) material requirements, including type, dimensions and amounts,
   vii) a cost estimate,
   viii) a computer-aided design (CAD) file,
   ix) a building information modelling (BIM) file,
   x) a list of one or more comparable building construction plans,
   xi) a comparison of the differences between one or more building construction plans,
   xii) a marked-up version of the building construction plan, highlighting one or more features on the building construction plan, or
   xiii) data configured to be received by another software application for purposes of project management, cost management, visualisation or construction review.

* * * * *

UNITED STATES PATENT AND TRADEMARK OFFICE
CERTIFICATE OF CORRECTION

PATENT NO. : 11,625,553 B2
APPLICATION NO. : 17/471956
DATED : April 11, 2023
INVENTOR(S) : Benjamin John Powles et al.

It is certified that error appears in the above-identified patent and that said Letters Patent is hereby corrected as shown below:

On the Title Page

Column 1 (Prior Publication Data), Line 2, below "US 2022/0391627 A1 Dec. 8, 2022" insert item (30) -- Foreign Application Priority Data Jun. 01, 2021 (AU) ........ 2021901634 --, as a new field entry.

Column 2 item (56) (Other Publications), Line 1, delete "'YOL09000:" and insert -- 'YOLO9000: --.

In the Specification

Column 2, Line 62, delete "1013" and insert -- 10B --.

Column 9, Line 18 (approx.), delete "I)" and insert -- l) --.

Column 18, Line 67, delete "sale" and insert -- sale. --.

Column 26, Line 51, delete "(Gans)" and insert -- (GANs) --.

Column 40, Line 36 (approx.), delete "H1.2KD*EMS*." and insert -- H1.2 KD *EMS*. --.

Column 40, Line 43 (approx.), delete "*EMS*.TRIM" and insert -- *EMS*. TRIM --.

In the Claims

Column 45, Line 47, Claim 1, delete "positioning" and insert -- positioning, --.

Column 45, Line 60, Claim 2, delete "claim" and insert -- claim 1, --.

Column 46, Line 57, Claim 10, delete "A" and insert -- a --.

Signed and Sealed this
Twenty-ninth Day of August, 2023

Katherine Kelly Vidal
*Director of the United States Patent and Trademark Office*